US009875156B2

(12) United States Patent
Sharon et al.

(10) Patent No.: US 9,875,156 B2
(45) Date of Patent: Jan. 23, 2018

(54) DATA STORAGE DEVICE WITH A MEMORY DIE THAT INCLUDES AN INTERLEAVER

(71) Applicant: SANDISK TECHNOLOGIES INC., Plano, TX (US)

(72) Inventors: Eran Sharon, Rishon Lezion (IL); Ariel Navon, Revava (IL); Alexander Tsang-Nam Chu, San Francisco, CA (US); Wanfang Tsai, Palo Alto, CA (US); Idan Alrod, Herzeliya (IL)

(73) Assignee: SanDisk Technologies LLC, Plano, TX (US)

( * ) Notice: Subject to any disclaimer, the term of this patent is extended or adjusted under 35 U.S.C. 154(b) by 42 days.

(21) Appl. No.: 14/872,473

(22) Filed: Oct. 1, 2015

(65) Prior Publication Data

US 2017/0097869 A1    Apr. 6, 2017

(51) Int. Cl.
| | |
|---|---|
| *G06F 11/10* | (2006.01) |
| *G11C 11/56* | (2006.01) |
| *G11C 16/26* | (2006.01) |
| *G11C 16/10* | (2006.01) |
| *G11C 29/52* | (2006.01) |
| *H03M 13/27* | (2006.01) |

(52) U.S. Cl.
CPC ...... *G06F 11/1072* (2013.01); *G11C 11/5628* (2013.01); *G11C 11/5642* (2013.01); *G11C 16/10* (2013.01); *G11C 16/26* (2013.01); *G11C 29/52* (2013.01); *H03M 13/2792* (2013.01)

(58) Field of Classification Search
CPC . G06F 11/1072; G11C 11/5628; G11C 16/29; G11C 16/10; G11C 16/5642; G11C 29/52
See application file for complete search history.

(56) References Cited

U.S. PATENT DOCUMENTS

| | | | |
|---|---|---|---|
| 7,944,754 B2 | 5/2011 | Cernea et al. | |
| 8,560,919 B2 | 10/2013 | D'Abreu et al. | |
| 8,811,080 B2 | 8/2014 | Kim et al. | |
| 2003/0097621 A1* | 5/2003 | Xin | H03M 13/2732 714/701 |
| 2008/0316816 A1* | 12/2008 | Lin | G11C 11/5628 365/185.03 |
| 2010/0165743 A1 | 7/2010 | Cernea et al. | |
| 2011/0010511 A1* | 1/2011 | Kinoshita | G06F 12/0246 711/157 |
| 2011/0170792 A1 | 7/2011 | Tourapis et al. | |

(Continued)

OTHER PUBLICATIONS

International Search Report and Written Opinion of the International Searching Authority dated Dec. 6, 2016 in International Application No. PCT/US2016/051607, 12 pages.

*Primary Examiner* — Sam Rizk
(74) *Attorney, Agent, or Firm* — Toler Law Group, PC

(57) ABSTRACT

A data storage device includes a set of latches, read/write circuitry, a memory, and an interleaver. The set of latches is configured to receive data. The read/write circuitry is coupled to the set of latches. The memory is coupled to the read/write circuitry. The interleaver is configured to interleave the data and to cause the read/write circuitry to program the interleaved data to the memory. The set of latches, the read/write circuitry, the memory, and the interleaver are integrated within a common die.

26 Claims, 9 Drawing Sheets

(56) References Cited

U.S. PATENT DOCUMENTS

2012/0102379 A1* 4/2012 D'Abreu .............. G06F 11/1072
                                                    714/763
2012/0311244 A1  12/2012 Huang et al.
2013/0024605 A1   1/2013 Sharon et al.
2015/0012684 A1*  1/2015 Avila .................... G06F 3/0688
                                                    711/103

* cited by examiner

US 9,875,156 B2

DATA STORAGE DEVICE WITH A MEMORY DIE THAT INCLUDES AN INTERLEAVER

FIELD OF THE DISCLOSURE

This disclosure is generally related to data storage devices and more particularly to interleaving processes for data storage devices.

BACKGROUND

Non-volatile storage devices have enabled increased portability of data and software applications. Non-volatile storage devices can enhance data storage density by storing multiple bits in each memory cell. For example, some non-volatile storage devices provide increased storage density by storing information that indicates two bits per cell, three bits per cell, four bits per cell, or more. Further, as semiconductor processes scale down, integrated circuits may store more information for a particular circuit area.

Error correction coding (ECC) is often used to correct errors that occur in data read from a memory device. Prior to storage, data may be encoded by an ECC engine to generate redundant information that may be stored with the data as an ECC codeword. An ECC engine has an error correction capability. Bit error rates (BERs) that exceed the error correction capability of the ECC engine cause "uncorrectable" error correction coding (UECC) errors.

Some data storage devices interleave data to reduce or avoid UECC errors. Interleaving the data may introduce latency in certain operations. For example, deinterleaving of the data during a read operation may cause read latency and may consume resources of a storage device. For example, to read a page, multiple pages may be read and portions of the pages may be shifted to deinterleave the pages, which may use multiple clock cycles and may cause read disturb effects to a memory (e.g., by reading multiple pages in response to a request to read one page).

DETAILED DESCRIPTION

A data storage device may include a controller and a memory device. The memory device may include an interleaver configured to perform a "checkerboard" interleaving of data to generate interleaved data. For example, if multiple pages of data are to be stored at a word line of the memory device, the interleaver may "distribute" portions (e.g., sets of bits) of the data using multiple pages (e.g., an upper page, a middle page, and a lower page). Interleaving the data using multiple pages of a word line may reduce average bit error rates (BERs) associated with distinct physical pages (e.g., the lower page, the middle page, and the upper page). Hence, interleaving the data may reduce BER differences of interleaved pages and may reduce a BER observed by the ECC engine. For example, the BER observed by the ECC engine may correspond to an average BER associated with the lower page, the middle page, and the upper page as opposed to a worst page BER. Reducing the BER observed by the ECC engine may reduce a likelihood that the BER of one of the logical pages exceeds an error correction capability of the ECC engine (e.g., by avoiding a circumstance in which one BER is relatively high and other BERs are relatively low).

Further, use of the checkerboard interleaving technique may simplify interleaving operations at the data storage device. For example, use of the checkerboard interleaving technique may enable the data storage device to avoid "horizontal" shifts of data during an interleaving process. In this case, data may be "vertically" shifted from an upper page to a middle page or to a lower page (e.g., instead of from being shifted from a first set of bit positions of the upper page to a second set of bit positions of the upper page).

A particular technique may be used to simplify reading of checkerboard interleaved data. For example, data that is interleaved using multiple pages of a word line may be sensed using a single ramp sensing operation (e.g., without performing multiple sensing operations to generate interleaved data and then "manually" deinterleaving the data). In other cases, multiple sensing operations may be performed to sense each page of the word line, and the data pages may be deinterleaved using a change-columns deinterleaving process (e.g., by "moving" portions of the data pages to deinterleave the pages, such as while the data pages are stored at a set of latches of the data storage device).

Particular aspects of the present disclosure are described below with reference to the drawings. In the description, common features are designated by common reference numbers. As used herein, "examplary" may indicate an example, an implementation, and/or an aspect, and should not be construed as limiting or as indicating a preference or a preferred implementation.

Figure 1:
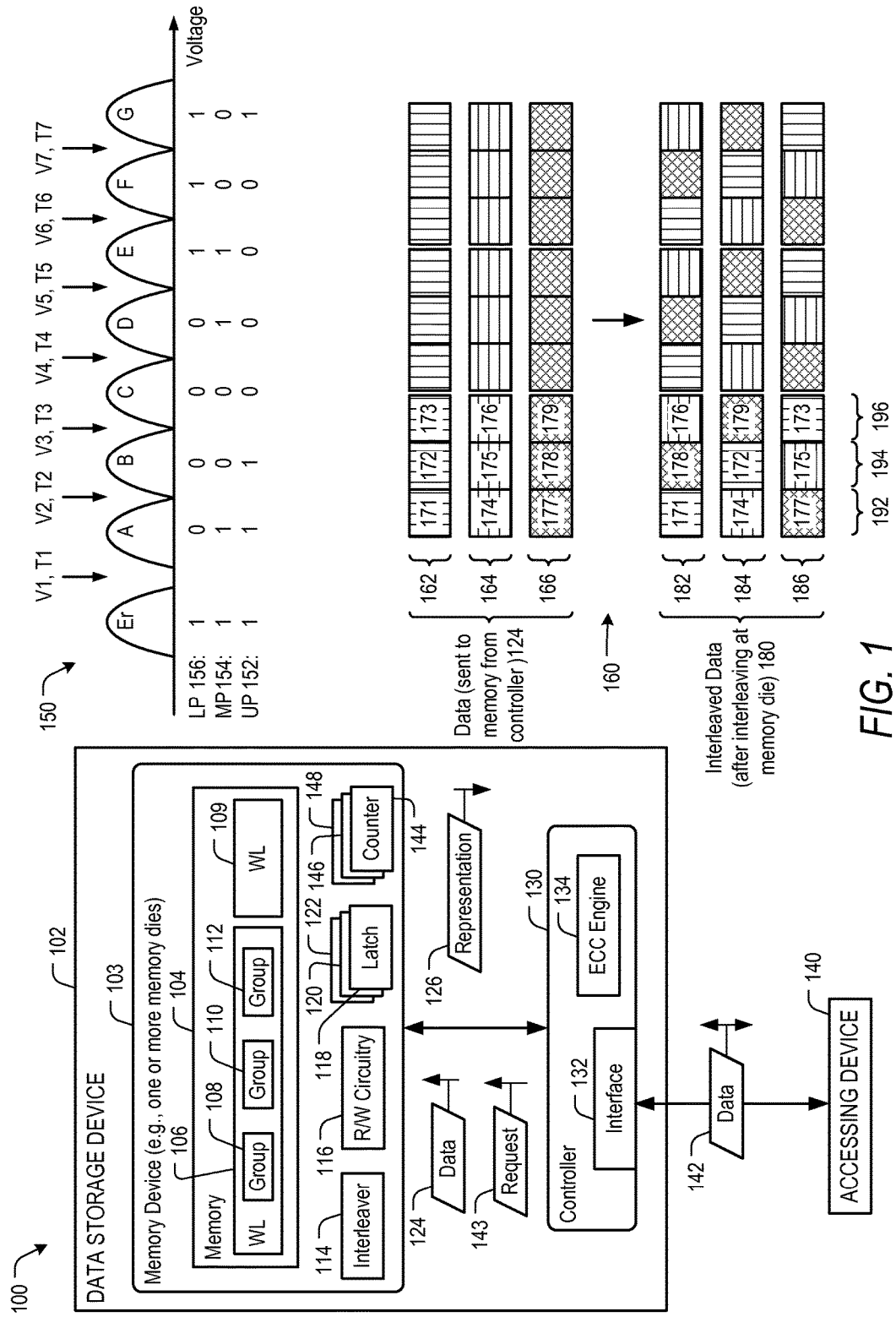
FIG. 1 is a block diagram illustrating certain aspects of an illustrative example of a system including a data storage device having one or more memory dies that include an interleaver.

FIG. 1 depicts illustrative examples of a system 100, a tri-level-cell (TLC) data storage scheme 150, and an interleaving process 160. The system 100 includes a data storage device 102 and an accessing device 140 (e.g., a host device or another device).

The data storage device 102 includes a memory device 103. The memory device 103 may include one or more memory dies (e.g., one memory die, two memory dies, eight memory dies, or another number of memory dies).

The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative examples. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more regions of storage elements. An example of a storage region is a block, such as a NAND flash erase group of storage elements. Another example of a storage region is a word line of storage elements, such as a word line 106 or a word line 109. A word line may function as a single-level-cell (SLC) word line, as a multi-level-cell (MLC) word line, or as a tri-level-cell (TLC) word line, as illustrative examples. For example, in some implementations described herein, the word line 106 may correspond to (or may be included in) an SLC partition of the memory 104, and the word line 109 may correspond to (or may be included in) a TLC word line of the memory 104. Each storage element of a word line may be programmable to a state (e.g., a threshold voltage in a flash configuration or a resistive state in a resistive memory configuration) that indicates one or more values. As an example, in an illustrative TLC scheme, each storage element of the word line 106 may be programmable to a state that indicates three values. A storage region may include multiple groups of storage elements. For example, the word line 106 may include a first group of storage elements 108, a second group of storage elements 110, and a third group of storage elements 112.

The memory device 103 may further include an interleaver 114 (e.g., an on-chip interleaver integrated within each memory die of the memory device 103), read/write circuitry 116, and a set of latches. In a particular implementation, the memory 104, the interleaver 114, the read/write circuitry 116, the set of latches, or a combination thereof, may be integrated within a common die. For example, the set of latches may include a first latch 118, a second latch 120, and a third latch 122. In an illustrative TLC implementation, the first latch 118 is configured to receive data to be stored as a lower page at the word line 106, the second latch 120 is configured to receive data to be stored as a middle page at the word line 106, and the third latch 122 is configured to receive data to be stored as an upper page at the word line 106. In other implementations, the latches 118, 120, and 122 may operate based on another technique (e.g., a four-bits-per-cell technique or a five-bits-per-cell technique, as illustrative examples). The memory device 103 may optionally include a set of counters (e.g., a first counter 144, a second counter 146, and a third counter 148), such as in connection with a ramp sensing implementation, as described further below.

The data storage device 102 may further include a controller 130 coupled to the memory device 103. The controller 130 may include an interface 132 (e.g., a host interface) and an error correcting code (ECC) engine 134. The interface 132 may be configured to enable the controller 130 to communicate with the accessing device 140. The ECC engine 134 may be configured to perform one or more ECC operations (e.g., encoding operations and/or decoding operations). For example, the ECC engine 134 may include one or more encoders, such as a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 134 may include one or more decoders, such as a Hamming decoder, an RS decoder, a BCH decoder, an LDPC decoder, a decoder configured to decode data according to one or more other ECC schemes, or a combination thereof.

During operation, the controller 130 is configured to receive data and instructions from the accessing device 140 using the interface 132. For example, the controller 130 may receive data 142 from the accessing device 140 via the interface 132. The data 142 may include one or more files (e.g., an image file, an audio file, and/or a video file, as illustrative examples) and/or other information to be stored at the data storage device 102.

In response to receiving the data 142, the controller 130 may input the data 142 to the ECC engine 134. The ECC engine 134 may encode the data 142 to generate data 124 (e.g., one or more ECC codewords). To illustrate, the data 124 may include a first page 162 (e.g., a set of one or more ECC codewords), a second page 164 (e.g., a second set of one or more ECC codewords), and a third page 166 (e.g., a third set of one or more ECC codewords). The controller 130 may send the data 124 to the memory device 103 (e.g., to be stored at the memory 104).

The memory device 103 may receive the data 124 from the controller 130. For example, the memory device 103 may receive the data 124 at the latches 118, 120, and 122. To further illustrate, the first latch 118 may be configured to receive the first page 162, the second latch 120 may be configured to receive the second page 164, and the third latch 122 may be configured to receive the third page 166. The controller 130 may indicate that a first set of bits of the data 124 is to be stored in the first page 162 by providing the first set of bits to the first latch 118, that a second set of bits of the data 124 is to be stored in the second page 164 by providing the second set of bits to the second latch 120, that a third set of bits of the data 124 is to be stored in the third page 166 by providing the third set of bits to the third latch 122, or a combination thereof.

The interleaver 114 may be configured, subsequent to the memory device 103 receiving the data 124 at the latches 118, 120, and 122, to access the data 124 and to interleave the data 124. For example, the interleaver 114 may be configured to interleave the data 124 in accordance with the interleaving process 160. In this example, the interleaver 114 may be configured to perform a "checkerboard" interleaving of the first page 162, the second page 164, and the third page 166 to generate interleaved data 180 that includes a first interleaved page 182, a second interleaved page 184, and a third interleaved page 186.

To further illustrate, the first page 162 may include a portion 171 (e.g., a set of one or more bits) having a first position within the first page 162, a portion 172 having a second position within the first page 162, and a portion 173 having a third position within the first page 162. The second page 164 may include a portion 174 having a fourth position within the second page 164, a portion 175 having a fifth position within the second page 164, and a portion 176 having a sixth position within the second page 164. The third page 166 may include a portion 177 having a seventh position within the third page 166, a portion 178 having an eighth position within the third page 166, and a portion 179 having a ninth position within the third page 166. In an illustrative example, the portions 171, 172, and 173 form a first ECC codeword (also referred to herein as an ECC page or ECC sector of the data 124) that represents a first set of bits of the data 142, the portions 174, 175, and 176 form a second ECC codeword that represents a second set of bits of the data 142, and portions 177, 178, and 179 form a third ECC codeword that represents a third set of bits of the data 142.

The interleaving process 160 may include a checkerboard interleaving process. For example, the checkerboard interleaving process may include shifting the portion 172 from the second position to the fifth position, shifting the portion 175 from the fifth position to the eighth position, and shifting the portion 178 from the eighth position to the second position. The interleaving process 160 may also include shifting the portion 173 from the third position to the ninth position, shifting the portion 176 from the sixth position to the third position, and shifting the portion 179 from the ninth position to the sixth position.

The word line 106 may be configured to store the interleaved data 180 using a particular data storage scheme. To illustrate, the TLC data storage scheme 150 depicts a particular mapping of bits of an upper page 152, a middle page 154, and a lower page 156 to an erase ("Er") state, an "A" state, a "B" state, a "C" state, a "D" state, an "E" state, an "F" state, and a "G" state. A most significant bit position may indicate a value of the lower page 156 and a least significant bit position may indicate a value of the upper page 152. In an illustrative example, the lower page 156 may be used to store the first interleaved page 182, the middle page 154 may be used to store the second interleaved page 184, and the upper page 152 may be used to store the third interleaved page 186. It should be appreciated that the examples of FIG. 1 are illustrative and that other implementations (e.g., different mappings of bits to states) are within the scope of the disclosure.

The read/write circuitry 116 may be configured to perform a write process to program the interleaved data 180 to the word line 106. For example, the read/write circuitry 116 may write the first interleaved page 182 to the word line 106 using the lower page 156, write the second interleaved page 184 to the word line 106 using the middle page 154, and write the third interleaved page 186 to the word line 106 using the upper page 152.

To further illustrate, the interleaved data 180 may include a first set of interleaved data 192, a second set of interleaved data 194, and a third set of interleaved data 196. The first set of interleaved data 192 includes the portions 171, 174, and 177. The second set of interleaved data 194 includes the portions 178, 172, and 175. The third set of interleaved data 196 includes the portions 176, 179, and 173. In this example, the first set of interleaved data 192 may be written to the first group of storage elements 108, the second set of interleaved data 194 may be written to the second group of storage elements 110, and the third set of interleaved data 196 may be written to the third group of storage elements 112. The interleaved data 180 may include one or more additional sets of interleaved data that are written to one or more additional groups of storage elements.

Use of the interleaving process 160 may enable the data storage device 102 to avoid horizontal data shifting operations associated with certain interleaving processes. For example, in the interleaving process 160, none of the portions 171-179 is shifted horizontally (e.g., from the first position to the second position, or vice versa). Further, it is noted that data shifting operations of the interleaving process 160 may correspond to "intra-cell" (vertical) shifts (e.g., by shifting a bit from targeting one of the pages 162-166 to target another of the pages 162-166 without changing a storage element targeted to store the bit) instead of "inter-cell" (horizontal) shifting (e.g., where a different storage element may be selected to store a bit). Avoiding horizontal data shifting operations may reduce complexity of circuitry and operation of the memory device 103 in some cases. For example, in some implementations, vertical shifting operations may be performed at the latches 118-122 (and horizontal shifting operations may utilize separate circuitry in addition to the latches 118-122).

In addition, use of the interleaving process 160 may reduce differences in bit error rates (BERs) associated with the pages 152, 154, and 156. For example, by "distributing" portions (e.g., the portions 171-179) of ECC codewords (e.g., the pages 162, 164, and 166) to generate the interleaved pages 182, 184, and 186, BERs of the ECC codewords corresponding to the first page 162, the ECC codewords corresponding to the second page 164, and the ECC codewords corresponding to the third page 166 may be approximately equal. "Smoothing" BERs of the ECC codewords may avoid circumstances in which one of the BERs exceeds an error correction capability of the ECC engine 134 (and may increase likelihood that each of the BERs is within the error correction capability of the ECC engine 134).

During operation, the memory device 103 may receive a request 143 for read access to the data 124 from the controller 130 (e.g., in response to a read request from the accessing device 140). The memory device 103 may be configured to perform a particular sensing process in response to the request 143 to facilitate simplified reading of the interleaved data 180 from the word line 106. For example, the data storage device 102 may be configured to perform an on-the-fly (OTF) deinterleaving and ramp sensing process at the word line 106 to sense at least a portion of the pages 152, 154, and 156 to generate a deinterleaved representation 126 of one of the pages 162-166 in response to the request 143. In some cases, the representation 126 may differ from one or more of the pages 162-166 (e.g., due to one or more read errors, a program disturb effect, one or more other errors, or a combination thereof).

Figure 2:
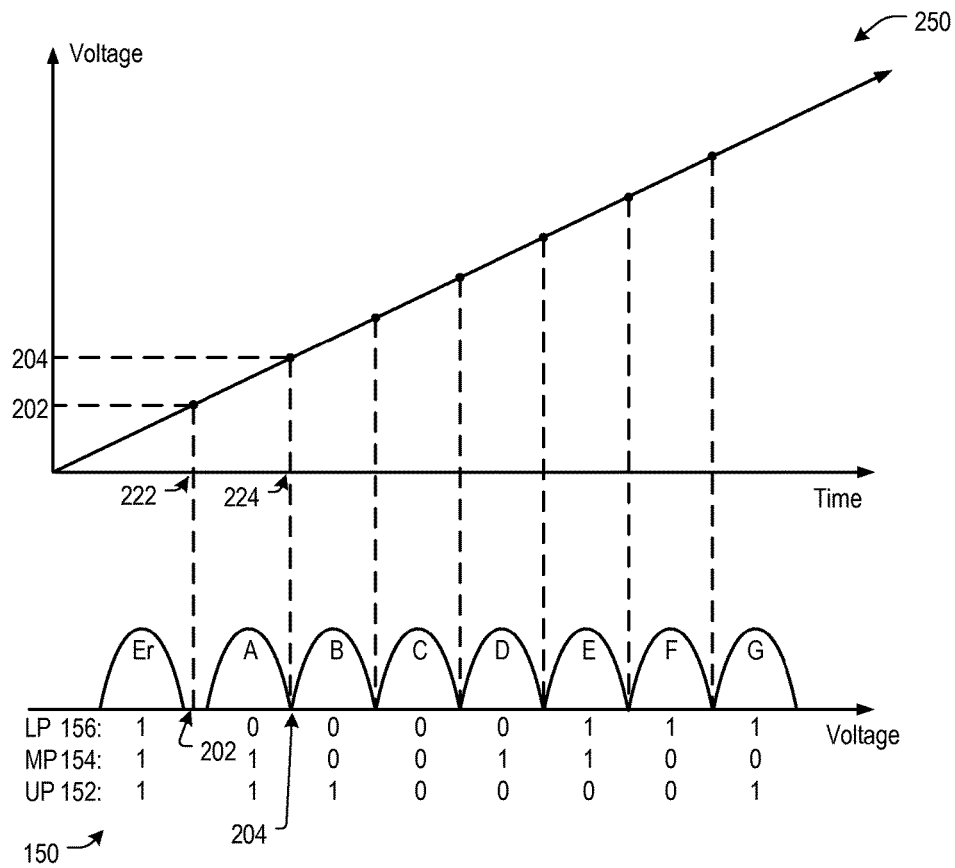
FIG. 2 is a diagram illustrating changes in a sensing voltage during a ramp sensing process and exemplary values of a counter used by a data storage device, such as the data storage device of FIG. 1.
Figure 4:
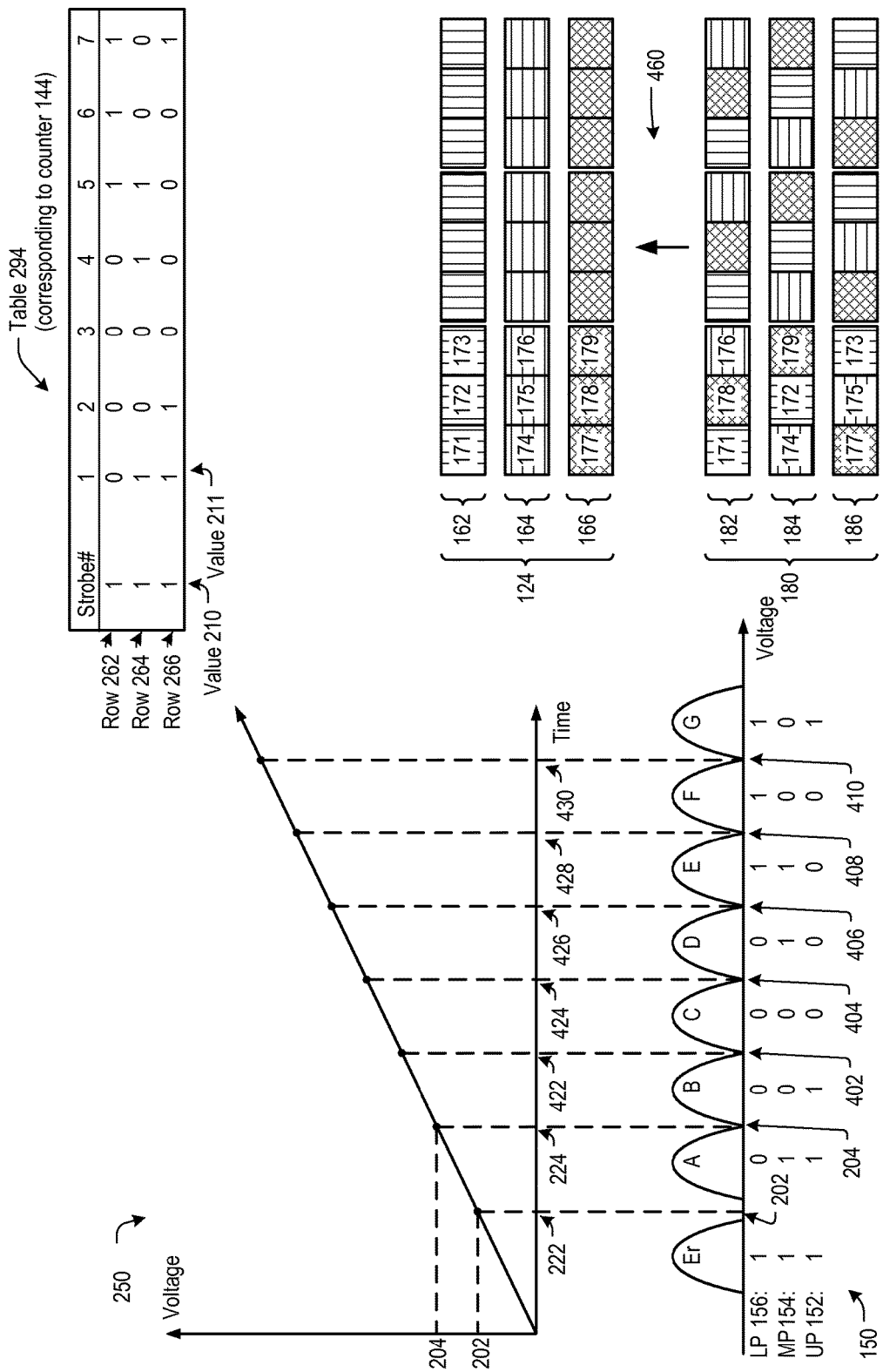
FIG. 4 is a diagram illustrating exemplary values of a counter and certain aspects of an example of a deinterleaving process performed by a data storage device, such as the data storage device of FIG. 1.

An OTF deinterleaving and ramp sensing process may include selectively sensing portions of the pages 152, 154, and 156 without sensing all of the pages 152, 154, and 156) to generate the representation 126. The OTF deinterleaving and ramp sensing process may use a "hybrid" sensing technique (e.g., a combination of lower, middle, and upper page sensing techniques) during a single ramp of the read voltage so that data read into a latch (e.g., the first latch 118) is deinterleaved. The single ramp may include increasing the read voltage applied to the word line 106, such as from a low voltage (e.g., a voltage that is less than an "Er" state target voltage) to a higher voltage (e.g., a voltage that is greater than a "G" state target voltage). FIGS. 2 and 4 illustrate examples of "ramped" read voltages.

To further illustrate, if the request 143 is for read access to the first page 162, a first OTF deinterleaving and ramp sensing process may be performed to generate a representation of the first page 162. During the first OTF deinterleaving and ramp sensing process, the read/write circuitry 116 may sense the first group of storage elements 108 using a first sensing technique (e.g., a lower page sensing technique if the portion 171 is stored using the lower page 156). The first sensing technique may include latching values sensed from the first group of storage elements 108 to the first latch 118 at a first time when the read voltage corresponds to a voltage V1 at a time T1. In the example of FIG. 1, storage elements of the first group of storage elements 108 that are activated at the time T1 may be associated with a logic "1" value (as indicated in the TLC data storage scheme 150). In addition, the first latch 118 may latch in values sensed from the first group of storage elements 108 at a time T5 when the read voltage corresponds to a voltage V5. In the example of FIG. 1, storage elements of the first group of storage elements 108 that are activated at the time T5 (but not the time T1) may be associated with a logic "0" value, and storage elements of the first group of storage elements 108 that are not activated at time T1 or at time T5 may be associated with a logic "1" value. Thus, the first OTF deinterleaving and ramp sensing process may generate a representation of the portion 171 at the first latch 118 by applying the first sensing technique to the first group of storage elements 108.

The first OTF deinterleaving and ramp sensing process may also generate a representation of the portion 172 at the first latch 118 by sensing the second group of storage elements 110 using a second sensing technique (e.g., a middle page sensing technique because the portion 172 is stored using the middle page 154). The second sensing technique may include latching values sensed from the second group of storage elements 110 at the first latch 118 when the read voltage corresponds to a voltage V2 at a time T2. The second sensing technique may further include latching values sensed from the second group of storage elements 110 at the first latch 118 when the read voltage corresponds to a voltage V4 at a time T4 and may also include latching values sensed from the second group of storage elements 110 at the first latch 118 when the read voltage corresponds to a voltage V6 at a time T6.

The first OTF deinterleaving and ramp sensing process may also generate a representation of the portion 173 by sensing the third group of storage elements 112 using a third sensing technique (e.g., an upper page sensing technique because the portion 173 is stored using the upper page 152). The third sensing technique may include latching values sensed from the third group of storage elements 112 at the first latch 118 when the read voltage corresponds to a voltage V3 at a time T3. The third sensing technique may further include latching values sensed from the third group of storage elements 112 at the first latch 118 when the read voltage corresponds to a voltage V7 at a time T7.

Further, it is noted that a second OTF deinterleaving and ramp sensing process may be performed to generate a representation of the second page 164. For example, the second OTF deinterleaving and ramp sensing process may include sensing the first group of storage elements 108 using the second sensing technique (to generate a representation of the portion 174), sensing the second group of storage elements 110 using the third sensing technique (to generate a representation of the portion 175), and sensing the third group of storage elements 112 using the first sensing technique (to generate a representation of the portion 176). A third OTF deinterleaving and sensing process to generate a representation of the third page 166 may include sensing the first group of storage elements 108 using the third sensing technique (to generate a representation of the portion 177), sensing the second group of storage elements 110 using the first sensing technique (to generate a representation of the portion 178), and sensing the third group of storage elements 112 using the second sensing technique (to generate a representation of the portion 178).

The representation 126 may include one or more of a representation of the first page 162 generated using the first OTF deinterleaving and sensing process, a representation of the second page 164 generated using the second OTF deinterleaving and sensing process, or a representation of the third page 166 generated using the third OTF deinterleaving and sensing process. The memory device 103 may provide the representation 126 from the first latch 118 to the controller 130. In a particular implementation, a single OTF deinterleaving and ramp sensing process may be performed to concurrently generate a representation of the first page 162 in the first latch 118, a representation of the second page 164 in the second latch 120, and a representation of the third page 166 in the third latch 122. For example, a single ramp sensing and OTF deinterleaving process may be performed to read multiple (e.g., 3) logical pages, by having each of the three latches sample (or latch) data at the appropriate time. For example, the latch 118 may latch the portion 171 at sampling points corresponding to the time T1 & the time T5, the portion 172 at sampling points corresponding to the time T2, the time T4, and the time T6, and the portion 173 at sampling points corresponding to the time T3 and the time T7. The latch 120 may latch the portion 174 at sampling points corresponding to the time T2, the time T4, and the time T6, the portion 175 at sampling points corresponding to the time T3 and the time T7, and the portion 176 at sampling points corresponding to the time T1 and the time T5. The latch 122 may latch the portion 177 at sampling points corresponding to the time T3 and the time T7, the portion 178 at sampling points corresponding to the time T1 and the time T5, and the portion 179 at sampling points corresponding to the time T2, the time T4, and the time T6. The times T1, T2, T3, T4, T5, and T6 may correspond to distinct sampling points.

Data may be latched at a sampling time Ti by setting a value of a latch to a particular page value if a corresponding sensed bit line is "on" (conducting) at the sampling time Ti and then inhibiting the latch from further sampling at subsequent sampling points. The particular page value may change polarity from one sampling time to the next. For example, the particular page value may have a first value (e.g., 1) at the time T1, may have as second value (e.g., 0) at time T2, may have the first value (e.g., 1) at the time T4, and may have the second value at the time T6.

An OTF deinterleaving and ramp sensing process may be performed using one or more counters, such as the first counter 144. For example, the memory device 103 may include multiple counters each corresponding to a respective bit line of the memory 104. The first counter 144 may be configured to count values (e.g., in accordance with a Gray coding scheme) as a read voltage applied to the word line 106 is increased (or "ramped"). For example, cycles of a clock signal (or a strobe signal) applied to the first counter 144 may correspond to (e.g., may be "timed" to) values of the read voltage, such as if a transition from a first cycle to a second cycle occurs when the read voltage has an "Er" state target voltage and if a transition from the second cycle to a third cycle occurs when the read voltage has an "A" state target voltage, etc.

Counting by the first counter 144 may be "stopped" when a particular storage element of the word line 106 is activated in response to the read voltage (e.g., when the particular storage element "turns on" in response to the read voltage satisfying the threshold voltage of the particular storage element and a voltage at the bit line transitions from a low logic value to a high logic value as a result). The value indicated by the first counter 144 when the particular storage element is activated may correspond to the threshold voltage of the particular storage element (and one or more bit values associated with the particular storage element). As an illustrative example, if the first counter 144 is "stopped" when the read voltage is approximately equal to the "C" state threshold voltage (e.g., between times T3 and T4), then a value stored by the first counter 144 may indicate that the particular storage element is associated with bits "000."

In a particular implementation, a single counter (e.g., the first counter 144) may be used to indicate bit values associated with multiple storage elements. For example, a value indicated by the first counter 144 when a particular storage element is activated may correspond to a threshold voltage of the particular storage element (and one or more bit values associated with the particular storage element). As an illustrative example, if the first counter 144 is "stopped" when a read voltage is approximately equal to the "C" state threshold voltage (e.g., between times T3 and T4), then a value stored by the first counter 144 may indicate that the particular storage element is associated with bits "000." A first bit value indicated by the first counter 144 may correspond to a portion (e.g., the portion 171) of the first interleaved page 182 stored at a first storage element. The first bit value indicated by the first counter 144 may correspond to a portion (e.g., the portion 172) of the second interleaved page 184 stored at a second storage element. A first bit of the first counter 144 may be coupled (e.g., wired) to a first portion of the first latch 118. The first portion of the first latch 118 may correspond to the first interleaved page 182. The first bit of the first counter 144 may be coupled (e.g., wired) to a second portion of the second latch 120. The second portion of the second latch 120 may correspond to the second interleaved page 184.

Values stored by one or more counters (e.g., the counters 144-148) may be sent from the memory device 103 to the controller 130 in connection with a request for read access (e.g., the request 143).

In some implementations, a counter may be configured to store one or more soft bits. For example, in addition to storing a value indicating the bits "000" when the first counter 144 is stopped between times T3 and T4, the first counter 144 may store one or more additional values indicating soft bits. The one or more soft bits may provide a higher resolution read of the threshold voltage of the particular storage element and may indicate a probability that a sensed threshold voltage is "correct." As an illustrative example, if a sensed threshold voltage is near a boundary between a "B" state target voltage and a "C" state target voltage, then the one or more soft bits may indicate a probability that a sensed "C" state threshold voltage is "incorrect." In a particular aspect, if the sensed threshold voltage is near the boundary between the "B" state target voltage and the "C" state target voltage, then the one or more soft bits may indicate low confidence in the sensed "C" state threshold voltage. As another illustrative example, if a sensed threshold voltage is not near a boundary, then the one or more soft bits may indicate a high confidence that the sensed state threshold voltage is "correct." For example, if the sensed threshold voltage is approximately in the middle of a first boundary between a "B" state target voltage and a "C" state target voltage and a second boundary between the "C" state target voltage and a "D" state target voltage, then the one or more soft bits may indicate a high confidence in the sensed "C" state threshold voltage.

Thus, an OTF deinterleaving and ramp sensing process may enable simplified deinterleaving operations at the memory device 103. For example, by using multiple sensing techniques (e.g., lower, middle, and upper page sensing techniques) in connection with a ramp sensing operation, portions of the pages 152-156 may be sensed selectively.

Although an OTF deinterleaving and ramp sensing process has been described, it should be appreciated that other sensing operations may be used in connection with a request for read access (e.g., the request 143), such as in connection with a device that does not utilize ramp sensing operations. To further illustrate, multiple sensing operations may be performed in response to the request 143 by sensing each of the interleaved pages 182-186 to generate representations of the interleaved pages 182-186. To illustrate, a representation of the first interleaved page 182 may include a representation of the portion 171, a representation of the second interleaved page 184 may include a representation of the portion 172, and a representation of the third interleaved page 186 may include a representation of the portion 173.

The representations of the interleaved pages 182-186 may be provided to the latches 118-122 by the read/write circuitry 116 (e.g., by providing the representation of the first interleaved page 182 at the first latch 118, by providing the representation of the second interleaved page 184 at the second latch 120, and by providing the representation of the third interleaved page 186 at the third latch 122). A change-columns deinterleaving process may be performed to deinterleave the representations of the interleaved pages 182-186 by "moving" portions stored by the latches 118-122 to the "correct" latches. For example, a representation of the portion 178 may be moved from the first latch 118 to the third latch 122, a representation of the portion 172 may be moved from the second latch 120 to the first latch 118, and a representation of the portion 175 may be moved from the third latch 122 to the second latch 120. As another example, a representation of the portion 176 may be moved from the first latch 118 to the second latch 120, a representation of the portion 179 may be moved from the second latch 120 to the third latch 122, and a representation of the portion 173 may be moved from the third latch 122 to the first latch 118. After moving the portions 172, 173, 175, 176, 178, and 179, the first latch 118 stores a representation of the first page 162 (instead of a representation of the first interleaved page 182), the second latch 120 stores a representation of the second page 164 (instead of a representation of the second interleaved page 184), and the third latch 122 stores a representation of the third page 166 (instead of a representation of the third interleaved page 186). In this example, the change-columns deinterleaving process deinterleaves a representation of the interleaved data 180 at the latches 118-122 (e.g., by moving the portions 172, 173, 175, 176, 178, 179 and one or more other portions of the interleaved data 180) to generate a representation of the data 124.

In some implementations, a change-columns deinterleaving process may be performed "automatically" by the memory device 103 (e.g., without receiving one or more commands from the controller 130 that indicate to deinterleave the representation of the interleaved data 180). In other implementations, the controller 130 may send a set of change-columns commands to the memory device 103 to cause the memory device 103 to "manually" deinterleave the representation of the interleaved data 180.

In some cases, a deinterleaving process may be initiated by the controller 130 without receiving a request from the accessing device 140. For example, the controller 130 may initiate an on-chip copy (OCC) operation to copy one of the pages 162-166 from the word line 106 to a destination location (e.g., to the word line 109). The OCC operation may be performed in connection with a compaction (or "garbage collection") process, as an illustrative example. Instead of generating representations of each of the interleaved pages 182-186 and sending the representations to the controller 130 to be deinterleaved, the OCC operation may include performing an on-memory deinterleaving process (e.g., an OTF deinterleaving and ramp sensing process or a change-columns deinterleaving process) without transferring data to the controller 130 to be deinterleaved by the controller 130. Thus, an OCC operation targeting interleaved data may be simplified using an on-memory deinterleaving process.

In a particular aspect, the controller 130 may, upon receiving the data 142 from the accessing device 140, store representations of the deinterleaved data (e.g., the data 124) in the latches 118-122 and may program (e.g., copy) the data 124 from the latches 118-122 into an SLC partition of the memory 104. The SLC partition of the memory 104 may operate as intermediate storage or as a cache. Writing the data 124 to the SLC partition may provide higher programming performance, as compared to writing the data 124 to a TLC partition of the memory 104. For example, writing the data 124 directly to the TLC partition of the memory 104 may increase random access memory (RAM) usage of the controller 130 and may reduce programming performance of the accessing device 140, as compared to writing the data 124 to intermediate storage (e.g., the SLC partition of the memory 104, the latches 118-122, or both).

The read/write circuitry 116 may copy the data 124 from the SLC partition of the memory 104 to the latches 118-122 and then back to the TLC partition of the memory 104 in the background without transferring the data 124 through the controller 130. As part of the internal on-memory-chip copy (e.g., an on-die copy operation) of data pages (e.g., 3 data pages) from the SLC partition to the TLC partition of the memory 104, the interleaver 114 may perform an interleaving process. For example, the interleaver 114 may perform an interleaving of each of the data pages that were stored as multiple SLC pages (e.g., 3 separate SLC pages) into TLC pages corresponding to a single TLC word line (WL). Subsequent to the interleaving, each SLC page may span across multiple TLC pages (e.g., 3 TLC pages) according to a checkerboard interleaving pattern. For example, the first latch 118 may store a representation of the first page 162 as read from a first SLC page, the second latch 120 may store a representation of the second page 164 as read from a second SLC page, and the third latch 122 may store a representation of the third page 166 as read from a third SLC page. The interleaver 114 or the read/write circuitry 116 may perform the interleaving process 160 to generate the interleaved data 180. The interleaved data 180 may include the first interleaved page 182, the second interleaved page 184, and the third interleaved page 186. The interleaved pages 182, 184, and 186 may be programmed (e.g., copied) to storage elements corresponding to a TLC WL of the TLC partition of the memory 104.

In a particular implementation, the interleaving process 160 may include a change-columns interleaving process. For example, the interleaver 114 may perform a change-columns interleaving process to interleave the representations of the data 124 by moving representations of portions of the data 124 stored in the latches 118-122. To illustrate, a representation of the portion 178 may be moved from the third latch 122 to the first latch 118, a representation of the portion 172 may be moved from the first latch 118 to the second latch 120, and a representation of the portion 175 may be moved from the second latch 120 to the third latch 122. In a particular aspect, a representation of a particular portion may differ from the particular portion due to one or more read errors, a program disturb effect, one or more other errors, or a combination thereof. As another example, a representation of the portion 176 may be moved from the second latch 120 to the first latch 118, a representation of the portion 179 may be moved from the third latch 122 to the second latch 120, and a representation of the portion 173 may be moved from the first latch 118 to the third latch 122. After moving the representations of the portions 172, 173, 175, 176, 178, and 179, the first latch 118 may store a representation of the first interleaved page 182, the second latch 120 may store a representation of the second interleaved page 184, and the third latch 122 may store a representation of the third interleaved page 186.

The interleaver 114 may use latch operations (e.g., logical operations) to move the representations of the portions of the data 124 stored in the latches 118-122. For example, the interleaver 114 may store one or more masks in one or more latches. The interleaver 114 may perform a logical-and operation, a logical-or operation, a logical exclusive-or operation, or another logical operation between first data stored at a first latch and second data stored at a second latch. The interleaver 114 may copy values from a particular latch to another latch prior to or subsequent to performing a logical operation on data stored in the particular latch, the other latch, or both.

In some embodiments, the logical operations performed on the latches 118, 120, and 122 may apply only on a full page. The interleaving process 160 may include operations that are to be applied to portions of pages. Mask pages may be used to apply operations to portions of pages. For example, the first page 162 may include the portions 171, 172, and 173. A mask page may include a first mask portion corresponding to the portion 171. The first mask portion may store bits corresponding to a first value (e.g., 1). The mask page may include a second mask portion corresponding to the portion 172 with bits corresponding to a second value (e.g., 0). The mask page may include a third mask corresponding to the portion 173 with bits corresponding to the second value. The interleaver 114 may apply a logical-AND operation between the first page 162 and the mask page to generate a fourth page. The fourth page may include the portion 171. The portions 172-173 may be replaced by bits corresponding to a particular value (e.g., the first value or the second value) in the fourth page. The interleaver 114 may apply the logical operations, which were to be applied to the portion 171, to the fourth page. Certain illustrative examples of logical operations that may be performed at the memory device 103 (e.g., at the latches 118-120) are described further with reference to FIG. 7.

The read/write circuitry 116 may write the interleaved data 180 from the latches 118-122 to the memory 104. For example, the read/write circuitry 116 may write the first set of interleaved data 192 from the latches 118-122 to the first group of storage elements 108, the second set of interleaved data 194 from the latches 118-122 to the second group of storage elements 110, and the third set of interleaved data 196 from the latches 118-122 to the third group of storage elements 112.

In a particular implementation, the interleaving process 160 may include an OTF interleaving process. The read/write circuitry 116 may fold and copy the data 124 from the latches 118-122 to the memory 104. For example, the read/write circuitry 116 may copy a representation of the portion 171 from the first latch 118 to a first portion of the first group of storage elements 108, a representation of the portion 174 from the second latch 120 to a second portion of the first group of storage elements 108, and a representation of the portion 177 from the third latch 122 to a third portion of the first group of storage elements 108. The read/write circuitry 116 may copy a representation of the portion 178 from the third latch 122 to a first portion of the second group of storage elements 110, a representation of the portion 172 from the first latch 118 to a second portion of the second group of storage elements 110, and a representation of the portion 175 from the second latch 120 to a third portion of the second group of storage elements 110. The read/write circuitry 116 may copy a representation of the portion 176 from the second latch 120 to a first portion of the third group of storage elements 112, a representation of the portion 179 from the third latch 122 to a second portion of the third group of storage elements 112, and a representation of the portion 173 from the first latch 118 to a third portion of the third group of storage elements 112.

The OTF interleaving process may be performed by adjusting verify levels (e.g., voltage levels) used for verifying that a memory cell (e.g., a storage element) has reached a programming destination according to the interleaving process 160. For example, first verify levels corresponding to the first group of storage elements 108 may be determined based on the portions 171, 174, and 177. Second verify levels corresponding to the second group of storage elements 110 may be determined according to "shifted" portions 178, 172, and 175 of the non-interleaved portions 172, 175, and 178. Third verify levels corresponding to the third group of storage elements 112 may be determined based on the "shifted" portions 176, 179, and 173 of the non-interleaved portions 173, 176, and 179.

The OTF interleaving process may be performed in a symmetric manner to the OTF deinterleaving process. Read operations of the OTF deinterleaving process may be replaced by verify operations. A verify operation may correspond to a read operation performed during programming of a storage element to determine that a threshold voltage (Vt) of the storage element reached has reached a programming destination (e.g., a target voltage) and the storage element is to be inhibited from further programming.

The examples of FIG. 1 may simplify operation of the data storage device 102 using on-memory interleaving and deinterleaving processes. For example, by performing interleaving and deinterleaving processes at the memory device 103, resources of the controller 130 may be available to perform other tasks. Further, by avoiding transfer of interleaved data to the controller 130 for deinterleaving, bandwidth of a connection between the controller 130 and the memory device 103 may be conserved. In some implementations, the examples of FIG. 1 may enable OCC of interleaved data, which may further reduce utilization of connection bandwidth and resources of the controller 130 (e.g., during a compaction process, as an illustrative example).

Thus, an OTF deinterleaving and ramp sensing process may enable simplified deinterleaving operations at the memory device 103. For example, by using multiple sensing techniques (e.g., lower, middle, and upper page sensing techniques) in connection with a ramp sensing operation, portions of the pages 152-156 may be sensed selectively to generate deinterleaved data. The OTF deinterleaving and ramp sensing process may simplify the deinterleaving operations by using sensing techniques to generate deinterleaved data without performing deinterleaving operations subsequent to sensing.

Referring to FIG. 2, a table 294 and a graph 250 are shown. The graph 250 illustrates changes in a sensing voltage during a ramp sensing process to read data, as described herein. The ramp sensing process may be performed by the data storage device 102. The table 294 illustrates exemplary values of the first counter 144 of FIG. 1. In a particular implementation, the data storage device 102 of FIG. 1 may update the first counter 144 to have values corresponding to the table 294, as described herein.

Using a "full" sensing approach, the read/write circuitry 116 may sense the interleaved data 180. For example, the read/write circuitry 116 may sense each of the pages 152-156 in its entirety to generate the interleaved data 180. The full sensing approach may be used prior to performing a change-columns deinterleaving process to deinterleave the interleaved data 180 by "moving" portions stored by the latches 118-122 to the "correct" latches, as described with reference to FIG. 1.

In a first implementation, the read/write circuitry 116 may apply one or more threshold voltages to generate the interleaved data 180. For example, the read/write circuitry 116 may apply a first threshold voltage 202 that is between an "Er" state target threshold voltage and an "A" state target threshold voltage to the first group of storage elements 108. The read/write circuitry 116 may determine that a storage element of the first group of storage elements 108 stores first particular bits (e.g., "111") in response to determining that the storage element begins conducting when the first threshold voltage 202 is applied to the storage element. A most-significant bit of the first particular bits (e.g., "111") may correspond to a first page (e.g., the lower page 156). A least-significant bit of the first particular bits (e.g., "111") may correspond to a second page (e.g., the upper page 152). A middle bit of the first particular bits (e.g., "111") may correspond to a third page (e.g., the middle page 154).

Alternatively, the read/write circuitry 116 may, in response to determining that the storage element remains non-conductive when the first threshold voltage 202 is applied, apply a second threshold voltage 204 that is between the "A" state target threshold voltage and a "B" state target threshold voltage to the first group of storage elements 108. The read/write circuitry 116 may determine that the storage element of the first group of storage elements 108 stores second particular bits (e.g., "011") in response to determining that the storage element begins conducting when the second threshold voltage 204 is applied to the storage element. In this implementation, the read/write circuitry 116 may perform multiple (e.g., up to seven) sensing operations per storage element of the first group of storage elements 108, the second group of storage elements 110, the third group of storage elements 112, or a combination thereof, to generate the interleaved data 180 of FIG. 1.

In a second implementation, the read/write circuitry 116 may sense the interleaved data 180 by ramping a sensing voltage. For example, the read/write circuitry 116 of FIG. 1 may apply a sensing voltage to the first group of storage elements 108 of the word line 106 of FIG. 1. The sensing voltage may change (e.g., increase or decrease) over time. For example, the read/write circuitry 116 may increase (or decrease) the sensing voltage based on a linear function with a constant ramp rate, as illustrated in the graph 250. At a first time 222, the sensing voltage may correspond to the first threshold voltage 202. At a second time 224, the sensing voltage may correspond to the second threshold voltage 204.

The read/write circuitry 116 may update a value of the first counter 144 while the sensing voltage is applied. For example, the value of the first counter 144 may be set to a first value 210 (e.g., "111") and the sensing voltage may satisfy (e.g., may be less than) the first threshold voltage 202. The read/write circuitry 116 may update the first counter 144 to a second value 211 (e.g., "011") at approximately the first time 222. For example, the read/write circuitry 116 may update the first counter 144 to a second value 211 when the sensing voltage fails to satisfy (e.g., increases above) the first threshold voltage. The first counter 144 may have the second value 211 while the sensing voltage satisfies (e.g., is less than) the second threshold voltage 204.

The read/write circuitry 116 may determine that a storage element of the first group of storage elements 108 stores particular bits based on a time at which the storage element begins to conduct in response to the sensing voltage ramping to a voltage level that exceeds the threshold voltage of the storage element (e.g., a floating gate transistor of a flash cell). For example, the read/write circuitry 116 may determine that the storage element stores first particular bits (e.g., "111") in response to determining that the storage element begins to conduct at approximately the first time 222. Alternatively, the read/write circuitry 116 may determine that the storage element of the first group of storage elements 108 stores second particular bits (e.g., "011") in response to determining that the storage element begins conducting at approximately the second time 224. In this implementation, the read/write circuitry 116 may perform a single sensing operation per storage element of the first group of storage elements 108, the second group of storage elements 110, the third group of storage elements 112, or a combination thereof, to generate the interleaved data 180 of FIG. 1.

The read/write circuitry 116 may use the ramp sensing process to sense the interleaved data 180 of FIG. 1. For example, the portion 171, the portion 174, and the portion 177 of FIG. 1 may be stored at a first storage element (or a first group of storage elements, such as the first group of storage elements 108) that is coupled to the word line 106. The read/write circuitry 116 may determine values corresponding to the portion 171, the portion 174, and the portion 177 by applying the sensing voltage to the word line 106 and determining a value of the first counter 144 at a time that the first storage element begins conducting. The portion 178, the portion 172, and the portion 175 may be stored at a second storage element (or a second group of storage elements, such as the second group of storage elements 110) that is coupled to the word line 106. The read/write circuitry 116 may determine values of the portion 178, the portion 172, and the portion 175 by applying the sensing voltage to the word line 106 and determining a value of the first counter 144 at a time that the second storage element begins conducting. For example, the first counter bit may correspond to the portion 178, the second counter bit may correspond to the portion 172, and the third counter bit may correspond to the portion 175. The portion 178 may be stored at a second position within the first interleaved page 182. The portion 172 may be stored at a second position with the second interleaved page 184. The portion 175 may be stored at a second position within the third interleaved page 186. Using the full sensing approach, the read/write circuitry 116 may generate the interleaved data 180.

Figure 3:
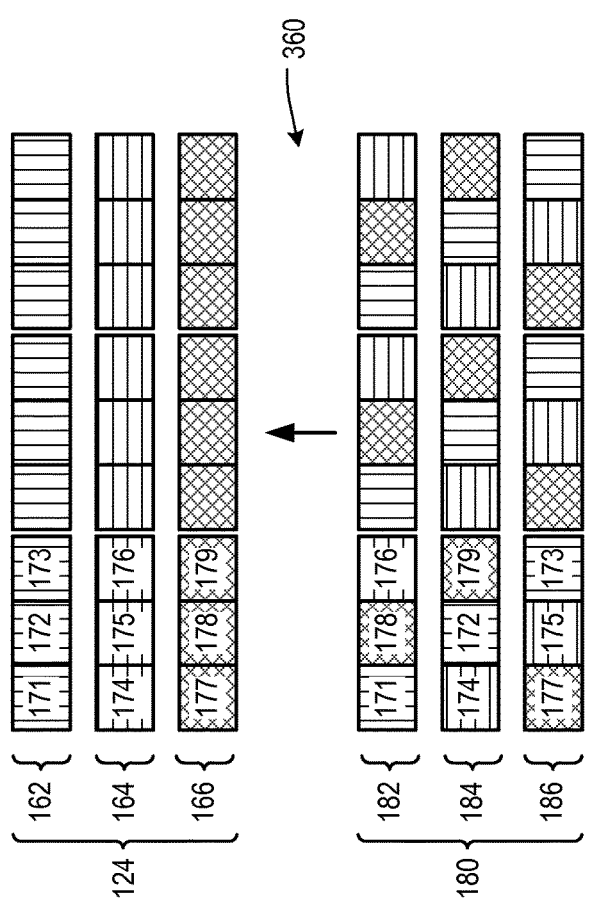
FIG. 3 is a diagram illustrating certain aspects of an example of a deinterleaving process performed by a data storage device, such as the data storage device of FIG. 1.

Referring to FIG. 3, a deinterleaving process is shown and generally designated 360. The data storage device 102 may be configured to generate the data 124 by performing the deinterleaving process 360 to deinterleave the interleaved data 180, as described herein. The deinterleaving process 360 may be an inverse of the interleaving process 160 of FIG. 1.

The interleaver 114 of FIG. 1 may perform the deinterleaving process 360 on the interleaved data 180 to generate the data 124. For example, the read/write circuitry 116 may perform a sensing process to generate the interleaved data 180, as described with reference to FIG. 2. The deinterleaving process 360 may correspond to the change-columns deinterleaving process described with reference to FIG. 1. For example, the interleaver 114 may, after the read/write circuitry 116 performs the sensing process, perform a change-columns deinterleaving process to generate a deinterleaved representation of the data (e.g., the data 124). To illustrate, the interleaver 114 may shift the portion 178 from the second position to the eighth position, the portion 172 from the fifth position to the second position, the portion 175 from the eighth position to the fifth position, the portion 176 from the third position to the sixth position, the portion 179 from the sixth position to the ninth position, the portion 173 from the ninth position to the third position, or a combination thereof.

Referring to FIG. 4, the table 294 and a deinterleaving process 460 are shown. The deinterleaving process 460 may correspond to an "on-the-fly" deinterleaving approach, as described herein. The deinterleaving process 460 may correspond to the OTF deinterleaving and ramp sensing process described with reference to FIG. 1.

Each page of the interleaved data 180 can be sensed separately without sensing other pages. For example, the upper page 152 can be sensed by sensing the word line 106 using a threshold voltage 402 between a "B" state target threshold voltage and a "C" state target threshold voltage, using a threshold voltage 410 between an "F" state target threshold voltage and a "G" state target threshold voltage, or both. In this example, the upper page 152 can be sensed without sensing the middle page 154 or the lower page 156. As another example, the middle page 154 can be sensed by sensing the word line 106 using the second threshold voltage 204, a threshold voltage 404 between the "C" state target threshold voltage and a "D" state target threshold voltage, using a threshold voltage 408 between an "E" state target threshold voltage and the "F" state target threshold voltage, or a combination thereof. In this example, the middle page 154 can be sensed without sensing the upper page 152 or the lower page 156. As a further example, the lower page 156 can be sensed by sensing the word line 106 using the first threshold voltage 202, a threshold voltage 406 between the "D" state target threshold voltage and the "E" state target threshold voltage, or both. In this example, the lower page 156 can be sensed without sensing the upper page 152 or the middle page 154.

Using the on-the-fly deinterleaving approach, portions of the interleaved data 180 stored across pages in distinct storage elements may be sensed during a single sensing operation. For example, the read/write circuitry 116 may ramp a sensing voltage and may perform OTF deinterleaving by using distinct sensing techniques to generate portions of data, as described herein. Each of the sensing techniques may correspond to distinct times. For example, a first sensing technique to sense the lower page 156 may correspond to the first time 222, a time 426, or both, as described herein. A second sensing technique to sense the middle page 154 may correspond to the second time 224, a time 424, a time 428, or a combination thereof, as described herein. A third sensing technique to sense the upper page 152 may correspond to a time 422, a time 430, or both, as described herein.

The read/write circuitry 116 may perform OTF deinterleaving by using the first sensing technique to generate a representation of a first portion (e.g., the portion 171) associated with the first group of storage elements 108 of FIG. 1. For example, the first group of storage elements 108 may store the portion 171 in the lower page 156. The read/write circuitry 116 may determine that a first bit stored in the lower page 156 at a first storage element of the first group of storage elements 108 corresponds to a first value (e.g., 0) in response to determining that the first storage element begins conducting at approximately the first time 222. The read/write circuitry 116 may determine that the first bit corresponds to a second value (e.g., 1) in response to determining that the first storage element begins conducting prior to the first time 222 or subsequent to the time 426 at which the sensing voltage corresponds to the threshold voltage 406. The read/write circuitry 116 may store the first bit of the portion 171 in the first latch 118.

The read/write circuitry 116 may perform OTF deinterleaving by using the second sensing technique to generate a representation of a second portion (e.g., the portion 172) associated with the second group of storage elements 110 of FIG. 1. For example, the second group of storage elements 110 may store the portion 172 in the middle page 154. The read/write circuitry 116 may determine that a second bit stored in the middle page 154 at a second storage element of the second group of storage elements 110 corresponds to the first value (e.g., 0) in response to determining that the second storage element begins conducting at approximately the second time 224 or at approximately the time 428 at which the sensing voltage corresponds to the threshold voltage 408. The read/write circuitry 116 may determine that the second bit corresponds to the second value (e.g., 1) in response to determining that the second storage element begins conducting prior to the second time 224 or subsequent to the time 424 at which the sensing voltage corresponds to the threshold voltage 404. The read/write circuitry 116 may store the second bit of the portion 172 in the second latch 120.

The read/write circuitry 116 may perform OTF deinterleaving by using the third sensing technique to generate a representation of a third portion (e.g., the portion 173) associated with the third group of storage elements 112 of FIG. 1. For example, the third group of storage elements 112 may store the portion 173 in the upper page 152. The read/write circuitry 116 may determine that a third bit stored in the upper page 152 at a third storage element of the third group of storage elements 112 corresponds to the first value (e.g., 0) in response to determining that the third storage element begins conducting at approximately the time 422 at which the sensing voltage corresponds to the threshold voltage 402. The read/write circuitry 116 may determine that the third bit corresponds to the second value (e.g., 1) in response to determining that the third storage element begins conducting prior to the time 422 or subsequent to the time 430 at which the sensing voltage corresponds to the threshold voltage 410. The read/write circuitry 116 may store the third bit of the portion 173 in the third latch 122. The read/write circuitry 116 may generate deinterleaved data (e.g., the data 124) during sensing. For example, the read/write circuitry 116 may generate the deinterleaved data (e.g., the data 124) without performing switching operations subsequent to the sensing.

Figure 5:
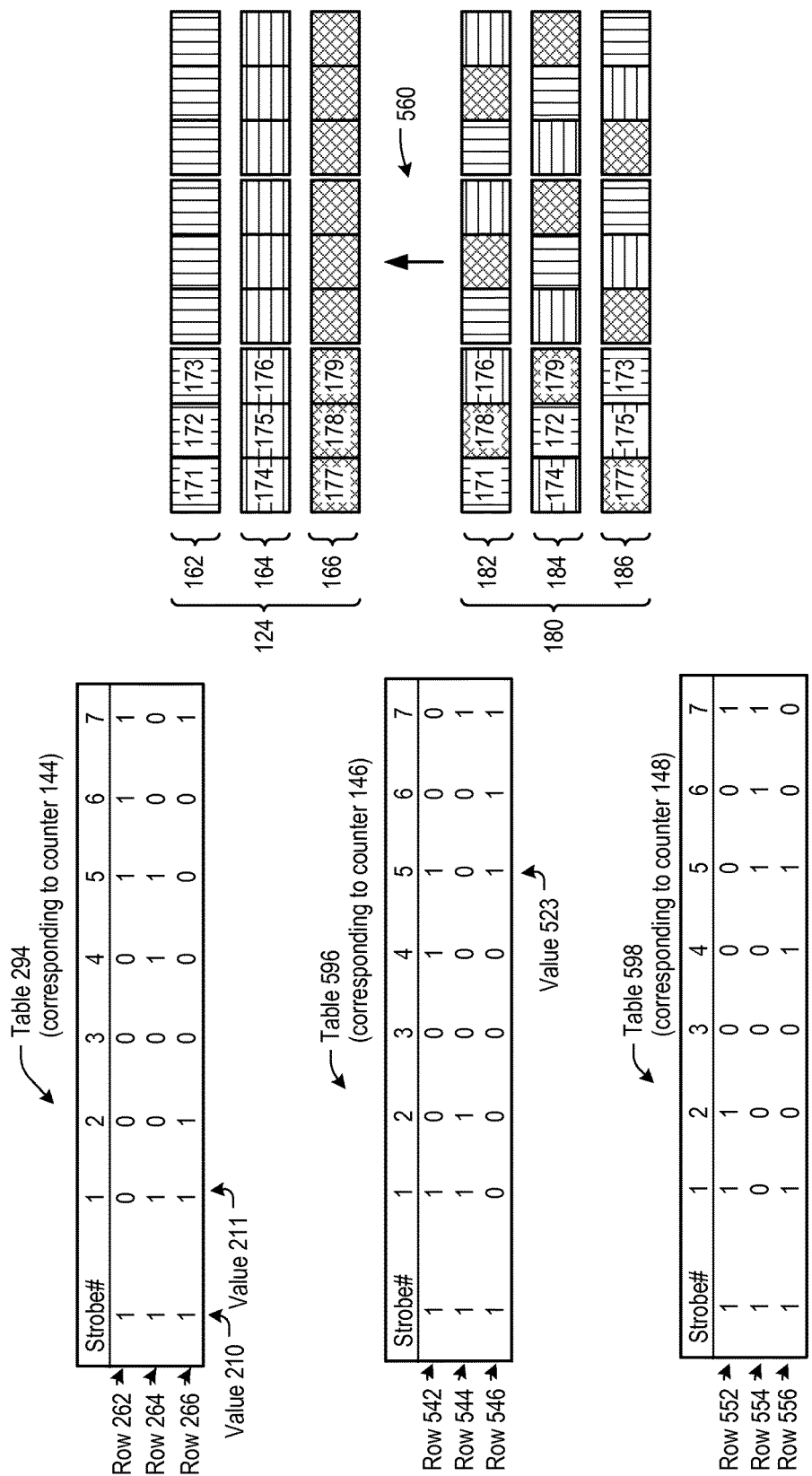
FIG. 5 is a diagram illustrating exemplary values of counters and certain aspects of another example of a deinterleaving process performed by a data storage device, such as the data storage device of FIG. 1.

Referring to FIG. 5, the table 294, a table 596, a table 598, and a deinterleaving process 560 are shown. Tables 294, 596, and 598 illustrate exemplary values of the first counter 144, the second counter 146, and the third counter 148. In a particular implementation, the data storage device 102 of FIG. 1 may update the first counter 144, the second counter 146, and the third counter 148 to have values corresponding to the table 294, the table 596, and the table 598. The deinterleaving process 560 may correspond to the OTF deinterleaving and ramp sensing process described with reference to FIG. 1.

The read/write circuitry 116 may perform on-the-fly (OTF) deinterleaving by using ramp sensing and multiple counters. The first counter 144 may correspond to the first group of storage elements 108. For example, the read/write circuitry 116 may determine that a first storage element of the first group of storage elements 108 stores first particular bits based on a value of the first counter 144. The second counter 146 may correspond to the second group of storage elements 110. For example, the read/write circuitry 116 may determine that a second storage element of the second group of storage elements 110 stores second particular bits based on a value of the second counter 146. The third counter 148 may correspond to the third group of storage elements 112. For example, the read/write circuitry 116 may determine that a third storage element of the third group of storage elements 112 stores third particular bits based on a value of the third counter 148, or a combination thereof.

A value indicated by the first counter 144 may be distinct from a value indicated by the second counter 146 for the same sensing voltage. For example, the read/write circuitry 116 may update the first counter 144 based on first values indicated in the table 294, may update the second counter 146 based on second values indicated in the table 596, may update the third counter 148 based on third values indicated in the table 598, or a combination thereof.

The first values may be shifted relative to the second values and the second values may be shifted relative to the third values. For example, the table 294 includes a row 262, a row 264, and a row 266. The table 596 includes a row 542, a row 544, and a row 546. The table 598 includes a row 552, a row 554, and a row 556. The row 262 corresponds to the row 546 and the row 554. A bit of the first counter 144 corresponding to the row 262 may indicate a value stored in the lower page 156. Since the row 546 corresponds to (e.g., has the same values as) the row 262, a bit of the second counter 146 corresponding to the row 546 may indicate a value stored in the lower page 156. Since the row 554 corresponds to (e.g., has the same values as) the row 262, a bit of the third counter 148 corresponding to the row 554 may indicate a value stored in the lower page 156. The row 264 corresponds to the row 542 and the row 556. A bit of the first counter 144 corresponding to the row 264 may indicate a value stored in the middle page 154. Since the row 542 corresponds to (e.g., has the same values as) the row 264, a bit of the second counter 146 corresponding to the row 542 may indicate a value stored in the middle page 154. Since the row 556 corresponds to (e.g., has the same values as) the row 264, a bit of the third counter 148 corresponding to the row 556 may indicate a value stored in the middle page 154. The row 266 corresponds to the row 544 and the row 552. A bit of the first counter 144 corresponding to the row 266 may indicate a value stored in the upper page 152. Since the row 544 corresponds to (e.g., has the same values as) the row 266, a bit of the second counter 146 corresponding to the row 544 may indicate a value stored in the upper page 152. Since the row 552 corresponds to (e.g., has the same values as) the row 266, a bit of the third counter 148 corresponding to the row 552 may indicate a value stored in the upper page 152.

The first values, the second values, and the third values may correspond to the interleaving process 160. For example, the row 542 may correspond to the row 264 if, during the interleaving process 160, a portion (e.g., the portion 172) of the data 124 is shifted from the first page 162 to be stored in the middle page 154 in the second group of storage elements 110. As another example, the row 542 may correspond to the row 266 if, during the interleaving process 160, a portion of the data 124 is shifted from the first page 162 to the upper page 152 in the second group of storage elements 110. The row 542 may correspond to the row 262 if, during the interleaving process 160, a portion of the data 124 from the first page 162 is stored in the lower page 156 at the second group of storage elements 110.

The read/write circuitry 116 may determine that the first counter 144 has a first value (e.g., the value 211) at a first time that the first storage element begins conducting. A first counter bit (e.g., "011") of the first counter 144 having the value 211 (e.g., "011") may correspond to the portion 171 stored at the first storage element in the lower page 156. The first counter bit may correspond to the row 262. A second counter bit (e.g., "011") of the first counter 144 may correspond to the portion 174 stored at the first storage element in the middle page 154. The second counter bit may correspond to the row 264. A third counter bit (e.g., "011") of the first counter 144 may correspond to the portion 177 stored at the first storage element in the upper page 152. The third counter bit may correspond to the row 266.

The read/write circuitry 116 may determine that the second counter 146 has a first value (e.g., a value 523) at a second time that the second storage element begins conducting. A first counter bit (e.g., "101") of the second counter 146 having the value 523 (e.g., "101") may correspond to the portion 172 stored at the second storage element in the middle page 154. For example, the first counter bit of the second counter 146 may correspond to the row 542 and the row 542 may correspond to the row 264.

A second counter bit (e.g., "101") of the second counter 146 having the value 523 (e.g., "101") may correspond to the portion 175 stored at the second storage element in the upper page 152. For example, the second counter bit of the second counter 146 may correspond to the row 544 and the row 544 may correspond to the row 266.

A third counter bit (e.g., "101") of the second counter 146 having the value 523 (e.g., "101") may correspond to the portion 178 stored at the second storage element in the lower page 156. For example, the third counter bit of the second counter 146 may correspond to the row 546 and the row 546 may correspond to the row 262.

The value 523 may correspond to deinterleaved data. For example, the value 523 may indicate deinterleaved data without shifting bits of the value 523 from one position to another. The read/write circuitry 116 may generate the data 124 by copying the value 211 from the first counter 144, the value 523 from the second counter 146, and a value of the third counter 148 to the first latch 118, the second latch 120, and the third latch 122 of FIG. 1. For example, the read/write circuitry 116 may generate the data 124 by copying a first particular portion of the value 211 to a first portion of the first latch 118. The first particular portion of the value 211 may correspond to the portion 171. The read/write circuitry 116 may copy a second particular portion of the value 211 to a first portion of the second latch 120. The second particular portion of the value 211 may correspond to the portion 174. The read/write circuitry 116 may copy a third particular portion of the value 211 to a first portion of the third latch 122. The third particular portion of the value 211 may correspond to the portion 177. The first portion of the first latch 118 may correspond to a first portion (e.g., the portion 171) of the first page 162. The first portion of the second latch 120 may correspond to a first portion (e.g., the portion 174) of the second page 164. The first portion of the third latch 122 may correspond to a first portion (e.g., the portion 177) of the third page 166.

The read/write circuitry 116 may copy a first particular portion of the value 523 (e.g., "101") from the second counter 146 to a second portion of the first latch 118. The first particular portion of the value 523 may correspond to the portion 172. The read/write circuitry 116 may copy a second particular portion of the value 523 to a second portion of the second latch 120. The second particular portion of the value 523 may correspond to the portion 175. The read/write circuitry 116 may copy a third particular portion of the value 523 to a second portion of the third latch 122. The third particular portion of the value 523 may correspond to the portion 178. The second portion of the first latch 118 may correspond to a second portion (e.g., the portion 172) of the first page 162. The second portion of the second latch 120 may correspond to a second portion (e.g., the portion 175) of the second page 164. The second portion of the third latch 122 may correspond to a second portion (e.g., the portion 178) of the third page 166.

The read/write circuitry 116 may copy a first particular portion of the value of the third counter 148 to a third portion of the first latch 118. The first particular portion of the value of the third counter 148 may correspond to the portion 173. The read/write circuitry 116 may copy a second particular portion of the value of the third counter 148 to a third portion of the second latch 120. The second particular portion of the value of the third counter 148 may correspond to the portion 176. The read/write circuitry 116 may copy a third particular portion of the value of the third counter 148 to a third portion of the third latch 122. The third particular portion of the value of the third counter 148 may correspond to the portion 179. The third portion of the first latch 118 may correspond to a third portion (e.g., the portion 173) of the first page 162. The third portion of the second latch 120 may correspond to a third portion (e.g., the portion 176) of the second page 164. The third portion of the third latch 122 may correspond to a third portion (e.g., the portion 179) of the third page 166. The first latch 118 may store deinterleaved data (e.g., the portion 171, the portion 172, and the portion 173) corresponding to the first page 162. The second latch 120 may store deinterleaved data (e.g., the portion 174, the portion 175, and the portion 176) corresponding to the second page 164. The third latch 122 may store deinterleaved data (e.g., the portion 177, the portion 178, and the portion 179) corresponding to the third page 166. The read/write circuitry 116 may thus perform on-the-fly deinterleaving by generating the deinterleaved data 124 in the latches 118, 120, and 122.

In a particular implementation, the interleaver 114 may cause the read/write circuitry 116 to sense the first storage element and the second storage element. The interleaver 114 may cause the read/write circuitry 116 to output the portion 171 and the portion 172 to the first latch 118, the portion 174 and the portion 175 to the second latch 120, the portion 177 and the portion 178 to the third latch 122, or a combination thereof.

The read/write circuitry 116 may receive a request for read access from the controller 130 of FIG. 1 (e.g., the request 143). The read/write circuitry 116 may, in response to receiving the request may perform OTF deinterleaving and ramp sensing to generate a deinterleaved representation of the data (e.g., the data 124). The read/write circuitry 116 may provide the data 124 to the controller 130.

In an alternate implementation, the read/write circuitry 116 may use a single counter (e.g., the first counter 144) to perform OTF deinterleaving. Counter bits of the counter may be wired differently to each portion of the latches 118, 120, and 122. For example, three counter bits denoted C0, C1, and C2 may be wired to the latches 118, 120, and 122 respectively in a first portion, and may be wired in a second shifted manner to the latches 120, 122, 118 respectively in a second portion, and may be wired in third shifted manner to the latches 122, 118, and 120 respectively in a third portion. In this example, each portion of the latches may sample a different shifted version of the counter bits C0, C1, and C2.

The data storage device 102 may perform an OTF deinterleaving process by using one or more counters. The OTF deinterleaving process may enable the data storage device 102 to determine deinterleaved data without performing shifting operations subsequent to sensing stored values.

Figure 6:
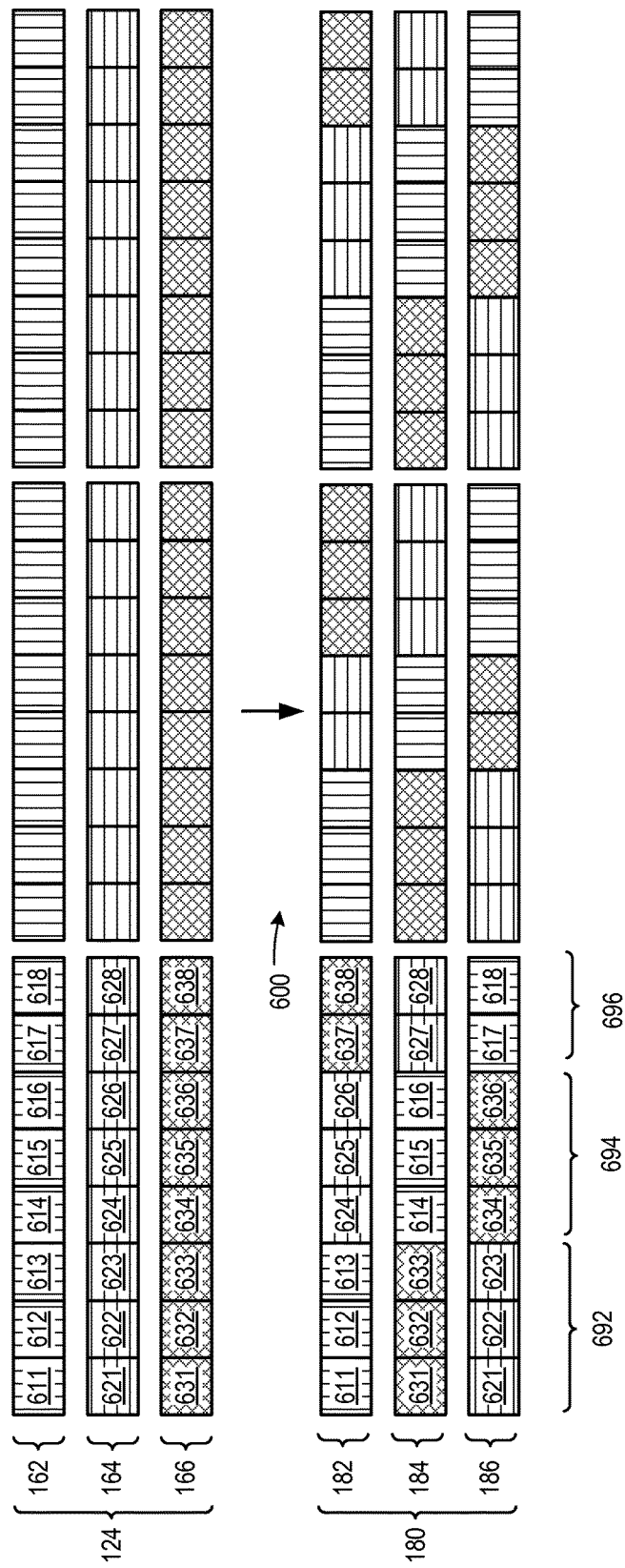
FIG. 6 is a diagram illustrating certain aspects of an example of an interleaving process performed by a data storage device, such as the data storage device of FIG. 1.

Referring to FIG. 6, an illustrative example of an interleaving process is depicted and generally designated 600. The interleaving process 600 may be performed at the data storage device 102 of FIG. 1, such as by the interleaver 114 of FIG. 1. The interleaving process 600 may include interleaving the data 124 to generate the interleaved data 180. The interleaving process 600 may correspond to the interleaving process 160 of FIG. 1.

In the example of FIG. 6, the interleaving process 600 is "non-uniform." For example, in FIG. 6, each ECC sector includes eight portions of a page. To illustrate, the first page 162 may include a portion 611 having a first position within the first page 162, a portion 612 having a second position within the first page 162, a portion 613 having a third position within the first page 162, a portion 614 having a fourth position within the first page 162, a portion 615 having a fifth position within the first page 162, a portion 616 having a sixth position within the first page 162, a portion 617 having a seventh position within the first page 162, and a portion 618 having an eighth position within the first page 162. The second page 164 may include a portion 621 having a first position within the second page 164, a portion 622 having a second position within the second page 164, a portion 623 having a third position within the second page 164, a portion 624 having a fourth position within the second page 164, a portion 625 having a fifth position within the second page 164, a portion 626 having a sixth position within the second page 164, a portion 627 having a seventh position within the second page 164, and a portion 628 having an eighth position within the second page 164. The third page 166 may include a portion 631 having a first position within the third page 166, a portion 632 having a second position within the third page 166, a portion 633 having a third position within the third page 166, a portion 634 having a fourth position within the third page 166, a portion 635 having a fifth position within the third page 166, a portion 636 having a sixth position within the third page 166, a portion 637 having a seventh position within the third page 166, and a portion 638 having an eighth position within the third page 166.

In an illustrative example, the portions 611, 612, 613, 614, 615, 616, 617, and 618 form a first ECC sector that represents a first set of bits of the data 124. The portions 621, 622, 623, 624, 625, 626, 627, and 628 may form a second ECC sector that represents a second set of bits of the data 124. The portions 631, 632, 633, 634, 635, 636, 637, and 638 may form a third ECC sector that represents a third set of bits of the data 124.

The interleaving process 160 of FIG. 1 may include shifting multiple consecutive portions of a first page to a second page. For example, the interleaving process 160 may include interleaving multiple consecutive portions of the first page 162, the second page 164, and the third page 166 to generate the first interleaved page 182, the second interleaved page 184, and the third interleaved page 186.

The interleaving process 160 may include shifting the portion 621 from the first position within the second page 164 to the first position within the third page 166, shifting the portion 612 from the second position within the second page 164 to the second position within the third page 166, and shifting the portion 613 from the third position within the second page 164 to the third position within the third page 166. The interleaving process 160 may include shifting the portion 631 from the first position within the third page 166 to the first position within the second page 164, shifting the portion 632 from the second position within the third page 166 to the second position within the second page 164, and shifting the portion 633 from the third position within the third page 166 to the third position within the second page 164.

The interleaving process 160 may include shifting the portion 614 from the fourth position within the first page 162 to the fourth position within the second page 164, shifting the portion 615 from the fifth position within the first page 162 to the fourth position within the second page 164, and shifting the portion 616 from the sixth position within the first page 162 to the sixth position within the second page 164. The interleaving process 160 may include shifting the portion 624 from the fourth position within the second page 164 to the fourth position within the first page 162, shifting the portion 625 from the fifth position within the second page 164 to the fifth position within the first page 162, and shifting the portion 626 from the sixth position within the second page 164 to the sixth position within the first page 162.

The interleaving process 160 may include shifting the portion 617 from the seventh position within the first page 162 to the seventh position within the third page 166 and shifting the portion 618 from the eighth position within the first page 162 to the eighth position within the third page 166. The interleaving process 160 may include shifting the portion 637 from the seventh position within the third page 166 to the seventh position within the first page 162 and shifting the portion 638 from the eighth position within the third page 166 to the eighth position within the first page 162.

A first set of interleaved data 692 includes the portions 611-638. The interleaved data 180 may further include a second set of interleaved data 694 and a third set of interleaved data 696. In this example, the first set of interleaved data 692 may be written to the first group of storage elements 108, the second set of interleaved data 694 may be written to the second group of storage elements 110, and the third set of interleaved data 696 may be written to the third group of storage elements 112.

Figure 7:
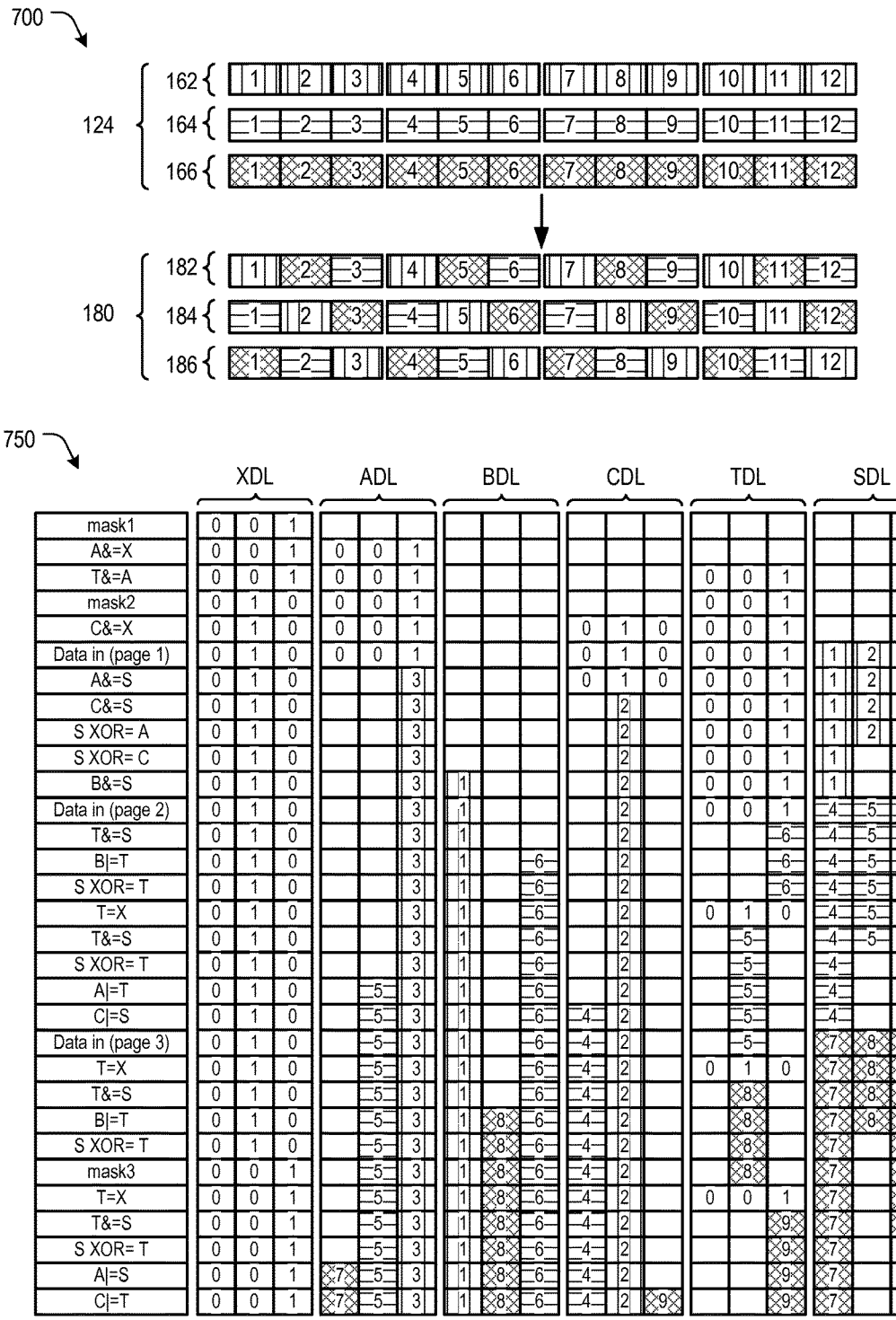
FIG. 7 is a diagram illustrating certain operations that may be performed at latches of a data storage device, such as the data storage device of FIG. 1, in connection with an interleaving process, such as the interleaving process of FIG. 6.

FIG. 7 depicts certain operations 750 that may be performed at a data storage device, such as the data storage device 102 of FIG. 1. The operations 750 may be performed in connection with an interleaving process 700. It should be appreciated that the operations 750 may be performed in connection with one or more other interleaving processes, such as the interleaving process 160 of FIG. 1, the interleaving process 600 of FIG. 6, one or more other interleaving processes, or a combination thereof.

The interleaving process 700 may interleave the data 124 to generate the interleaved data 180. For example, the interleaving process 700 may include interleaving portions of the pages 162, 164, and 166 (indicated in FIG. 7 as "1," "2," "3," "4," "5," "6," "7," "8," "9," "10," "11," and "12") to generate the interleaved pages 182, 184, and 186.

The operations 750 illustrate that the interleaving process 700 may be performed at a set of latches. In FIG. 7, the set of latches includes an "X" data latch (XDL), an "A" data latch (ADL), a "B" data latch (BDL), a "C" data latch (CDL), a "T" data latch (TDL), and an "S" data latch (SDL). Any of the latches described with reference to FIG. 7 may correspond to the latches 118, 120, and 122 of FIG. 1.

The operations 750 may include applying masks (mask1, mask2, and mask3) to the XDL latch (e.g., by storing "001" values to the XDL latch in connection with mask1). In FIG. 7, blank entries of the set of latches may refer to zero values. For example, the data latches ADL, BDL, CDL, TDL, and SDL may store zero values when the mask (mask1) is applied to the XDL latch.

The operations 750 may further include performing bitwise AND assignment operations, such as a bitwise AND assignment operation from the XDL data latch to the ADL data latch ("A&=X") to copy contents of the XDL data latch to the ADL data latch. As another example, FIG. 7 shows that the operations 750 may include performing a bitwise AND assignment operation from the ADL data latch to the TDL data latch ("T&=A") to copy contents of the ADL data latch to the TDL data latch.

The operations 750 may also include loading data to a latch. For example, a portion of the first page 162 ("1," "2," and "3") may be loaded to the SDL data latch ("data in (page 1)"). As another example, a portion of the second page 164 ("4," "5," and "6") may be loaded to the SDL data latch ("data in (page 2)"). As an additional example, a portion of the third page 166 may be loaded to the SDL data latch ("data in (page 3)").

The operations 750 may include one or more other operations. For example, FIG. 7 depicts that the operations 750 may include one or more bitwise exclusive OR assignment operations ("XOR="), one or more bitwise OR assignment operations ("|="), and one or more assignment operations ("="). In some implementations, the operations 750 may include one or more other operations, such as one or more negation operations and/or one or more not AND operations, as illustrative examples.

After performing the interleaving process 700 using the operations 750, interleaved data (e.g., the interleaved data 180) may be written from the data latches ADL, BDL, and CDL to the memory 104 of FIG. 1. For example, the read/write circuitry 116 of FIG. 1 may write the interleaved data 180 from the data latches ADL, BDL, and CDL to the word line 106 of FIG. 1 (e.g., using a TLC write process).

In some implementations, the operations 750 of FIG. 7 are initiated by the interleaver 114 of FIG. 1. In other implementations, the operations 750 of FIG. 7 are initiated by the controller 130 of FIG. 1. For example, the controller 130 may be configured to send commands to the memory device 103 of FIG. 1 to initiate any of the operations 750. Each of the commands may include an opcode indicating a particular operation, a particular source data latch, and/or a particular destination data latch. In some cases, the interleaver 114 may be omitted from the data storage device 102 of FIG. 1 (e.g., where commands from the controller 130 are used to initiate the operations 750).

The example of FIG. 7 illustrates that latch-based operations (e.g., the operations 750) may be used in connection with an interleaving process, such as the interleaving process 700. The latch-based operations may enable an on-die interleaving process at the memory device 103 of FIG. 1.

Figure 8:
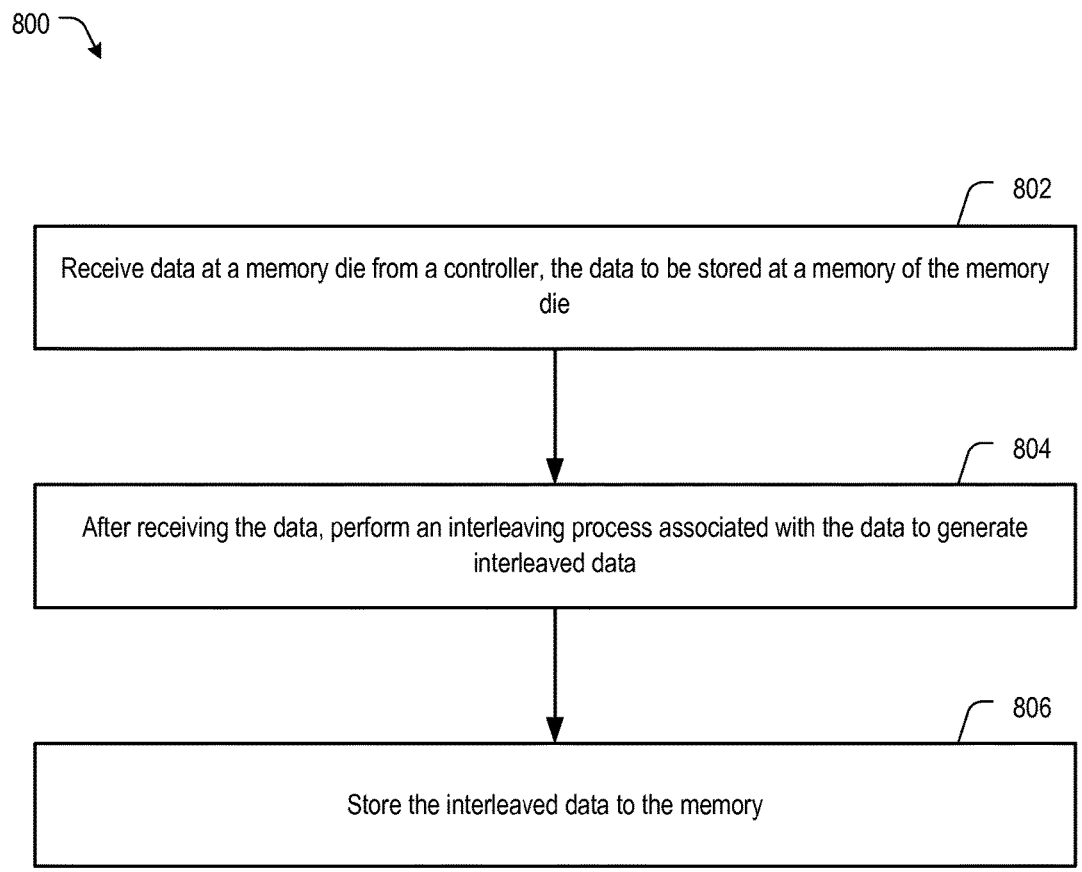
FIG. 8 is a flow diagram of an illustrative embodiment of a method of operation of a data storage device, such as the data storage device of FIG. 1.

Referring to FIG. 8, an illustrative example of a method is depicted and generally designated 800. The method 800 may be performed at a data storage device (e.g., the data storage device 102 of FIG. 1) that includes a memory die (e.g., a memory die included in the memory device 103) and a controller (e.g., the controller 130). The memory die includes a memory (e.g., the memory 104 of FIG. 1).

The method 800 includes receiving data at the memory die from the controller, at 802. The data is to be stored at the memory. For example, the memory device 103 of FIG. 1 may receive the data 124 to be stored at the memory 104 from the controller 130 of FIG. 1. In an illustrative implementation, the memory die further includes a set of latches, such as the latches 118-122.

The method 800 also includes performing an interleaving process associated with the data to generate interleaved data, at 804. For example, the interleaving process may include one or more operations of any of the interleaving processes 160, 600, and 700 to generate the interleaved data 180, as described with reference to FIGS. 1, 6, and 7. The interleaving process may be performed according to a checkerboard interleaving process to enable the memory die to avoid horizontal shifting of the data and to reduce differences in BERs associated with reading the first page, the second page, and the third page. The interleaving process may be performed after receiving the data 124 at the latches 118-122.

The method 800 further includes storing the interleaved data to the memory, at 806. For example, the read/write circuitry 116 may store the interleaved data 180 to the memory 104, as described with reference to FIG. 1. Storing the data to the memory includes programming a set of states (e.g., threshold voltages in a flash memory implementation or resistive states in a resistive memory implementation) representing the first page, the second page, and the third page to a word line (e.g., the word line 106) of the memory in an interleaved sequence.

In a particular implementation, the interleaving process may be performed using latch operations, such as the operations 750 of FIG. 7. For example, the interleaving process may include performing logical operations on the latches 118-122, as described with reference to FIG. 1. For example, the read/write circuitry 116 may read deinterleaved data from the latches 118-122 and write interleaved data to the memory 104. To illustrate, the read/write circuitry 116 may copy the portion 171 from the first latch 118 to a first portion of the first group of storage elements 108, the portion 174 from the second latch 120 to a second portion of the first group of storage elements 108, and the portion 177 from the third latch 122 to a third portion of the first group of storage elements 108. The read/write circuitry 116 may copy the portion 178 from the third latch 122 to a first portion of the second group of storage elements 110, the portion 172 from the first latch 118 to a second portion of the second group of storage elements 110, and the portion 175 from the second latch 120 to a third portion of the second group of storage elements 110.

In an alternate implementation, the interleaving process may include OTF interleaving, such as described with reference to FIG. 1. The OTF interleaving may be performed in connection with programming of data to the memory 104, such as in connection with a verification process. The verification process may include interpreting values stored by the latches 118, 120, and 122 as states to verify (i.e., verify levels) at storage elements of the memory 104, where the interpretation is different for different portions of the latches (e.g., for portions of the latches 118, 120, and 122 storing the sets of interleaved data 192, 194, and 196). For example, for the first group of storage elements 108, a first set of verify levels may be determined according to the portions 171, 174, and 177. As another example, for the second group of storage elements 110, a second set of verify levels different than the first set may be determined according to the portions 172, 175, and 178. The second set of verify levels may enable the read/write circuitry 116 to program the portions 172, 175, and 178 using the middle page 154, the upper page 152, and the lower page 156, respectively (instead of using the lower page 156, the middle page 154, and the upper page 152, respectively, as would occur in connection with use of the first set of verify levels). As an additional example, for the third group of storage elements 112, a third set of verify levels different than the first set and the second set may be determined according to the portions 173, 176, and 179. The third set of verify levels may enable the read/write circuitry 116 to program the portions 173, 176, and 179 using the upper page 152, the lower page 156, and the middle page 154, respectively (instead of using the lower page 156, the middle page 154, and the upper page 152, respectively, as would occur in connection with use of the first set of verify levels). Thus, the data 124 (instead of the interleaved data 180) may be stored at the latches 118-122 during the interleaving process, and the read/write circuitry 116 may "shift" verify levels during a verification process in order to cause the interleaved data 180 (instead of the data 124) to be programmed to the memory 104.

In some implementations, the verification process may be performed using a ramp sensing technique. For example, write voltages applied to the word line 106 of FIG. 1 may be "ramped" in accordance with the graph 250 during the verification process, and values of a counter (e.g., the counter 144) may be accessed and interpreted differently for each of the groups 108-112. For example, for the first group of storage elements 108, counter bits C0, C1, and C2 of the counter may be interpreted as page0, page1, and page2 (e.g., the pages 156, 154, and 152, respectively). As another example, for the second group of storage elements 110, counter bits C0, C1, and C2 of the counter may be interpreted as page2, page0, and page1 (e.g., the pages 152, 154, and 156, respectively). As an additional example, for the third group of storage elements 112, counter bits C0, C1, and C2 of the counter may be interpreted as page1, page2, and page0 (e.g., the pages 154, 152, and 156, respectively). In this example, during a verification process of an interleaving process, each portion of the latches 118-122 uses a different shifted version of the counter as the state according to which the verify level is determined (such that once a threshold voltage of a cell satisfies the verify level, then the cell is inhibited from further programming). To further illustrate, a different permuted version of counter bits may be accessed for the first group of storage elements 108 of the memory 104 and the second group of storage elements 110 of the memory 104, such as by detecting a first permutation of the counter bits C0, C1, and C2 for the first group of storage elements 108 and by detecting a second permutation of the counter bits C0, C1, and C2 for the second group of storage elements 110. Further, the techniques are applicable to an OTF deinterleaving process. For example, during a read process, each portion of the latches 118-122 may sample a different shifted version of the counter (once a respective bit line is activated).

In an illustrative example, the interleaving process includes shifting a first set of bits (e.g., the portion 172) of the data from targeting a first page (e.g., from targeting the lower page 156) to a second page (e.g., the middle page 154). For example, if the read/write circuitry 116 is configured to program bits stored in the first latch 118 using the lower page 156 and to program bits stored in the second latch 120 using the middle page 154, the interleaver 114 may be configured to perform the interleaving process by moving the portion 172 from the first latch 118 to the second latch 120 (or by using another technique to cause the read/write circuitry 116 to program the portion 172 using the middle page 154 instead of using the lower page 156). To further illustrate, the interleaving process may include shifting a second set of bits (e.g., the portion 173) of the data from targeting the first page to a third page (e.g., the upper page 152). For example, if the read/write circuitry 116 is configured to program bits stored in the first latch 118 using the lower page 156 and to program bits stored in the third latch 122 using the upper page 152, the interleaver 114 may be configured to perform the interleaving process by moving the portion 173 from the first latch 118 to the third latch 122 (or by using another technique to cause the read/write circuitry 116 to program the portion 173 using the upper page 152 instead of using the lower page 156). As an additional example, the interleaving process may include shifting a third set of bits of the data from targeting the third page to the first page, such as by shifting the portion 178 from targeting the upper page 152 to the lower page 156.

Figure 9:
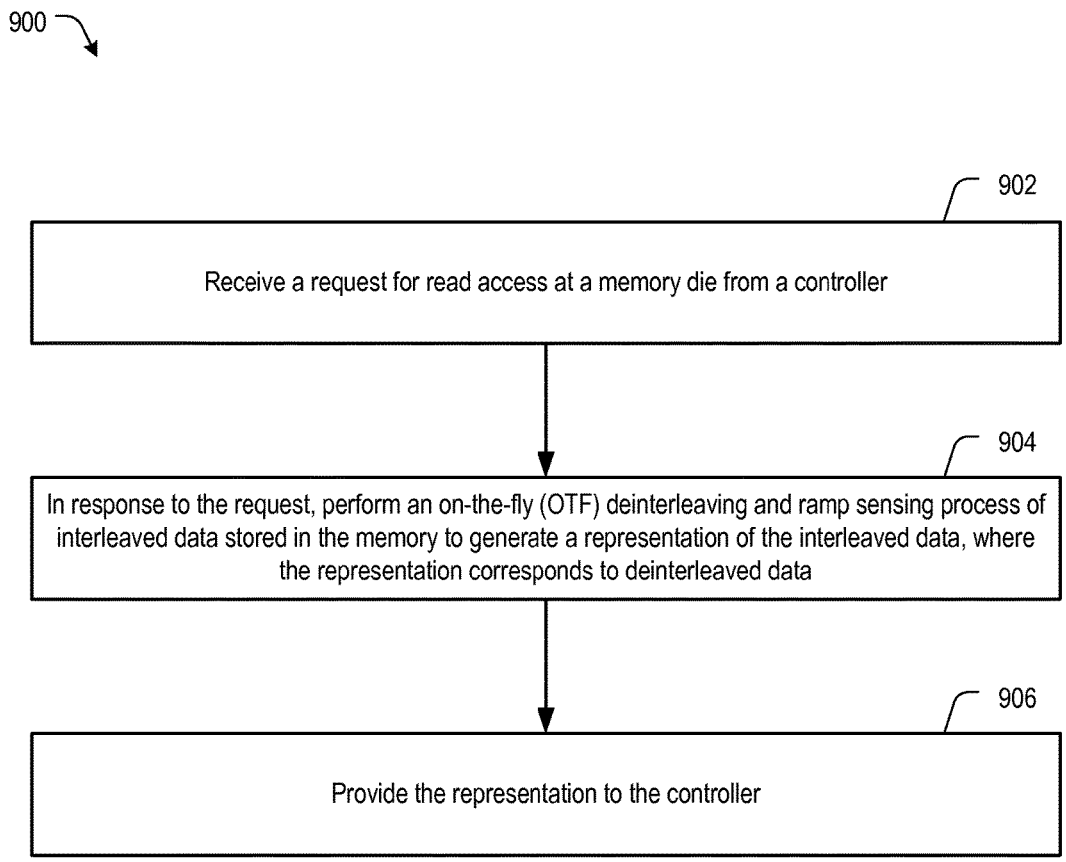
FIG. 9 is a flow diagram of another embodiment of a method of operation of a data storage device, such as the data storage device of FIG. 1.

Referring to FIG. 9, an illustrative example of a method is depicted and generally designated 900. The method 900 may be performed at a data storage device (e.g., the data storage device 102 of FIG. 1) that includes a memory die (e.g., a memory die included in the memory device 103) and a controller (e.g., the controller 130). The memory die includes a memory (e.g., the memory 104 of FIG. 1).

The method 900 includes receiving a request for read access at a memory die from a controller, at 902. For example, the memory device 103 may receive the request 143 from the controller 130, as described with reference to FIG. 1.

The method 900 also includes, in response to the request, performing an on-the-fly (OTF) deinterleaving and ramp sensing process of interleaved data stored in the memory to generate a representation of the interleaved data, at 904. For example, the memory device 103 may perform an OTF deinterleaving and ramp sensing process of the interleaved data 180 stored in the memory 104 to generate the deinterleaved representation 126, as described with reference to FIG. 1. The deinterleaved representation 126 may correspond to the data 124.

The method 900 further includes providing the representation of the deinterleaved data to the controller, at 906. For example, the memory device 103 may provide the deinterleaved representation 126 to the controller 130, as described with reference to FIG. 1.

Although the interleaver 114 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform one or more operations described herein with reference to methods, devices, and systems of FIGS. 1-9. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

The data storage device 102 may be coupled to, attached to, or embedded within one or more accessing devices, such as within a housing of the accessing device 140. For example, the data storage device 102 may be embedded within the accessing device 140 in accordance with a Joint Electron Devices Engineering Council (JEDEC) Solid State Technology Association Universal Flash Storage (UFS) configuration. To further illustrate, the data storage device 102 may be integrated within an electronic device (e.g., the accessing device 140), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 102 may be implemented in a portable device configured to be selectively coupled to one or more external devices, such as a host device. For example, the data storage device 102 may be removable from the accessing device 140 (i.e., "removably" coupled to the accessing device 140). As an example, the data storage device 102 may be removably coupled to the accessing device 140 in accordance with a removable universal serial bus (USB) configuration.

The accessing device 140 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The accessing device 140 may communicate via a controller, which may enable the accessing device 140 to communicate with the data storage device 102. The accessing device 140 may operate in compliance with a JEDEC Solid State Technology Association industry specification, such as an embedded MultiMedia Card (eMMC) specification or a Universal Flash Storage (UFS) Host Controller Interface specification. The accessing device 140 may operate in compliance with one or more other specifications, such as a Secure Digital (SD) Host Controller specification as an illustrative example. Alternatively, the accessing device 140 may communicate with the data storage device 102 in accordance with another communication protocol. In some implementations, the interleaver 114, the memory device 103, the data storage device 102, or the memory 104 may be integrated within a network-accessible data storage system, such as an enterprise data system, an NAS system, or a cloud data storage system, as illustrative examples.

In some implementations, the data storage device 102 may include a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the accessing device 140 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the accessing device 140 as embedded memory, such as in connection with an embedded MultiMedia Card (EMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a MicroSD® card, a MiniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 104 may include another type of memory. In a particular embodiment, the data storage device 102 is indirectly coupled to an accessing device (e.g., the accessing device 140) via a network. For example, the data storage device 102 may be a network-attached storage (NAS) device or a component (e.g., a solid-state drive (SSD) component) of a data center storage system, an enterprise storage system, or a storage area network. The memory 104 may include a semiconductor memory device.

Semiconductor memory devices include volatile memory devices, such as dynamic random access memory ("DRAM") or static random access memory ("SRAM")

devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a set of latches configured to receive data;
   read/write circuitry coupled to the set of latches;
   a memory coupled to the read/write circuitry; and
   an interleaver configured to interleave the data and to cause the read/write circuitry to program the interleaved data to a storage region of the memory,
   wherein the read/write circuitry is configured to sense the storage region using a first sense technique associated with a first page and using a second sense technique associated with a second page to generate a deinterleaved representation of the data and to provide the deinterleaved representation of the data to the set of latches, and
   wherein the set of latches, the read/write circuitry, the memory, and the interleaver are integrated within a common die.

2. The data storage device of claim 1, wherein the read/write circuitry is configured to access the interleaved data from the set of latches and to program the interleaved data to a word line of the memory.

3. The data storage device of claim 2, further comprising a counter, wherein the counter is configured to store a value indicating one or more values of the data during a read operation from the word line, the read operation including an on-the-fly (OTF) ramp sensing and deinterleaving process.

4. The data storage device of claim 1, wherein the memory has a three-dimensional (3D) memory configuration that is monolithically formed in one or more physical levels of arrays of memory cells having an active area above a silicon substrate, and further comprising circuitry associated with operation of the memory cells.

5. The data storage device of claim 1, wherein the interleaver is further configured to interleave the data by shifting a bit of the data from the first page to the second page while maintaining a common bit position of the bit from the first page to the second page.

6. A method comprising:
   in a data storage device that includes a controller coupled to a memory die, wherein the memory die includes a memory and a plurality of latches, performing by the memory die:
      receiving data at the memory die from the controller, the data to be stored at the memory;
      after receiving the data, performing an interleaving process associated with the data to generate interleaved data;
      storing the interleaved data to a region of the memory;
      sensing the region of the memory using a first read technique associated with a first page and using a second read technique associated with a second page to generate a deinterleaved representation of the data; and
      providing the deinterleaved representation of the data to the plurality of latches.

7. The method of claim 6, wherein the controller indicates that a first set of bits of the data and a second set of bits of the data are to be stored using the first page, and wherein the interleaving process includes causing the first set of bits to target the second page and causing the second set of bits to target a third page.

8. The method of claim 7, wherein the first page is an upper page, wherein the second page is a middle page, and wherein the third page is a lower page.

9. The method of claim 7, wherein the first set of bits and the second set of bits are included in an error correcting code (ECC) codeword.

10. The method of claim 7, wherein the controller indicates that a third set of bits of the data is to be stored at the third page, and wherein the interleaving process further includes causing the third set of bits to target the first page.

11. The method of claim 7, wherein the interleaving process includes a checkerboard interleaving process that enables the memory die to avoid horizontal shifting of the data.

12. The method of claim 6, wherein the interleaving process is performed using logical operations at the plurality of latches.

13. The method of claim 6, wherein the interleaving process is an on-the-fly (OTF) interleaving process that includes performing a verification process that uses a first group of verify levels for a first group of storage elements of the memory, a second group of verify levels for a second group of storage elements of the memory, and a third group of verify levels for a third group of storage elements of the memory.

14. The method of claim 13, wherein the verification process is performed using a ramp sensing technique.

15. The method of claim 14, wherein the ramp sensing technique includes accessing counter bits stored by a counter.

16. The method of claim 15, wherein a different permuted version of the counter bits is accessed for a first group of storage elements of the memory and a second group of storage elements of the memory.

17. The method of claim 6, wherein the interleaving process is performed using an on-die copy operation from a single-level cell (SLC) partition of the memory to a tri-level-cell (TLC) partition of the memory.

18. The method of claim 17, further comprising:
   prior to interleaving the data:
      programming the data to the SLC partition; and
      reading the data from the SLC partition, wherein the data is interleaved after reading the data from the SLC partition; and
   after interleaving the data to generate the interleaved data, programming the interleaved data to a TLC word line of the TLC partition so that different portions of the data are stored using different logical pages of the TLC word line.

19. The method of claim 6, further comprising:
   receiving a request for read access from the controller;
   wherein sensing the region of the memory includes performing, in response to the request, a sensing process to generate a representation of a first interleaved page, a representation of a second interleaved page, and a representation of a third interleaved page; and wherein providing the deinterleaved representation of the data to the plurality of latches includes providing the representation of the first interleaved page to a first latch of the plurality of latches, the representation of the second interleaved page to a second latch of the plurality of latches, and the representation of the third interleaved page to a third latch of the plurality of latches.

20. The method of claim 19, further comprising performing a change-columns deinterleaving process, wherein the change-columns deinterleaving process includes:

while the first latch stores a representation of a first portion of the first interleaved page, moving a representation of a second portion of the second interleaved page from the second latch to the first latch; and moving a representation of a third portion of the third interleaved page from the third latch to the second latch.

21. The method of claim 6, further comprising receiving the data from the controller at the plurality of latches, wherein the interleaving process is performed after receiving the data at the plurality of latches.

22. A device comprising:

means for storing interleaved data;

means for performing an on-the-fly (OTF) deinterleaving and ramp sensing process using a first sensing technique associated with a first page and using a second sensing technique associated with a second page to generate a representation of the interleaved data, wherein the representation corresponds to deinterleaved data; and means for receiving the representation from the means for performing the OTF deinterleaving and ramp sensing process and for storing the representation, wherein the means for storing the interleaved data, the means for performing the OTF deinterleaving and ramp sensing process, and the means for storing the representation are integrated within a common die.

23. The device of claim 22, wherein the means for performing the OTF deinterleaving and ramp sensing process is configured to:

generate a representation of a first portion of the interleaved data using the first sensing technique at a first group of storage elements of a word line of the means for storing the interleaved data;

generate a representation of a second portion of the interleaved data using the second sensing technique at a second group of storage elements of the word line; and generate a representation of a third portion of the interleaved data using a third sensing technique that is associated with a third page and that is performed at a third group of storage elements of the word line.

24. The device of claim 23, wherein the means for performing the OTF deinterleaving and ramp sensing process is further configured to provide the representation of the first portion, the representation of the second portion, and the representation of the third portion to a latch of the means for storing the representation.

25. A method comprising:

in a data storage device that includes a controller coupled to a memory die, wherein the memory die includes a memory and a cache, performing by the memory die:

receiving a request for read access from the controller;

in response to the request, performing an on-the-fly (OTF) deinterleaving and ramp sensing process of interleaved data stored in the memory using a first sensing technique associated with a first page and using a second sensing technique associated with a second page to generate a representation of the interleaved data, wherein the representation corresponds to deinterleaved data;

providing the representation of the interleaved data to the cache; and providing the representation of the interleaved data from the cache to the controller.

26. The method of claim 25, wherein performing the OTF deinterleaving and ramp sensing process includes:

using the first sensing technique at a first group of storage elements of a word line to generate a representation of a first portion of the interleaved data;

using the second sensing technique at a second group of storage elements of the word line to generate a representation of a second portion of the interleaved data; and using a third sensing technique associated with a third page at a third group of storage elements of the word line to generate a representation of a third portion of the interleaved data.

* * * * *